(12) United States Patent
Kwon

(10) Patent No.: US 12,261,103 B2
(45) Date of Patent: Mar. 25, 2025

(54) SEMICONDUCTOR PACKAGE

(71) Applicant: SAMSUNG ELECTRONICS CO., LTD., Suwon-si (KR)

(72) Inventor: Yonghwan Kwon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 601 days.

(21) Appl. No.: 17/647,144

(22) Filed: Jan. 5, 2022

(65) Prior Publication Data

US 2022/0384322 A1 Dec. 1, 2022

(30) Foreign Application Priority Data

May 31, 2021 (KR) .......................... 10-2021-0069883

(51) Int. Cl.
*H01L 23/48* (2006.01)
*H01L 23/31* (2006.01)
*H01L 23/498* (2006.01)
*H01L 25/10* (2006.01)
*H01L 23/00* (2006.01)

(52) U.S. Cl.
CPC .... *H01L 23/49816* (2013.01); *H01L 23/3128* (2013.01); *H01L 23/49822* (2013.01); *H01L 25/105* (2013.01); *H01L 24/05* (2013.01); *H01L 24/16* (2013.01); *H01L 24/48* (2013.01); *H01L 2224/05624* (2013.01); *H01L 2224/05647* (2013.01); *H01L 2224/16227* (2013.01); *H01L 2224/48227* (2013.01)

(58) Field of Classification Search
CPC ............... H01L 23/49822; H01L 24/05; H01L 2224/16227

USPC .................................................. 257/773, 786
See application file for complete search history.

(56) References Cited

U.S. PATENT DOCUMENTS

| | | | |
|---|---|---|---|
| 8,450,856 B2 * | 5/2013 | Kang | .................. H01L 21/4835 |
| | | | 257/784 |
| 8,669,174 B2 | 3/2014 | Wu et al. | |
| 9,000,584 B2 | 4/2015 | Lin et al. | |
| 9,023,717 B2 | 5/2015 | Nakagawa et al. | |
| 9,117,825 B2 | 8/2015 | Liu et al. | |
| 9,799,620 B2 | 10/2017 | Huang et al. | |
| 10,074,618 B1 * | 9/2018 | Chen | ....................... H01L 24/19 |
| 10,157,874 B2 | 12/2018 | Tsai et al. | |
| 10,157,900 B2 * | 12/2018 | Liang | .................. H01L 25/0657 |
| 10,165,682 B2 | 12/2018 | Hsieh et al. | |

(Continued)

*Primary Examiner* — Nitin Parekh
(74) *Attorney, Agent, or Firm* — Wolf, Greenfield & Sacks, P.C.

(57) ABSTRACT

A semiconductor package includes a semiconductor chip on a first redistribution substrate, a molding layer that covers the semiconductor chip, and a second redistribution substrate on the molding layer and that includes a dielectric layer, a redistribution pattern, and a conductive pad. The dielectric layer includes a lower opening that exposes the conductive pad, and an upper opening connected to the lower opening and that is wider than the lower opening. The semiconductor package also comprises a redistribution pad on the conductive pad and that covers a sidewall of the lower opening and a bottom surface of the upper opening. A top surface of the dielectric layer is located at a higher level than a top surface of the redistribution pad. The top surface of the redistribution pad is located on the bottom surface of the upper opening.

20 Claims, 29 Drawing Sheets

(56) References Cited

U.S. PATENT DOCUMENTS

| | | |
|---|---|---|
| 10,790,162 B2 | 9/2020 | Tsai et al. |
| 2009/0065936 A1 | 3/2009 | Ong et al. |
| 2014/0210101 A1* | 7/2014 | Lin .................. H01L 23/49827 257/774 |
| 2018/0151530 A1* | 5/2018 | Chen ....................... H01L 24/14 |
| 2018/0366411 A1* | 12/2018 | Suk ..................... H01L 23/5389 |
| 2019/0006283 A1* | 1/2019 | Wang .................. H01L 23/5386 |
| 2019/0096869 A1* | 3/2019 | Kim .................... H01L 21/6835 |
| 2019/0122981 A1 | 4/2019 | Plavidal et al. |
| 2020/0083201 A1* | 3/2020 | Suk ........................ H01L 24/08 |
| 2020/0117874 A1* | 4/2020 | Yu ........................ H01L 23/3128 |
| 2020/0328144 A1* | 10/2020 | Fan ........................ H01L 21/56 |
| 2021/0096310 A1* | 4/2021 | Chang .................... H01L 24/19 |
| 2021/0118788 A1* | 4/2021 | Lee ........................ H01L 24/20 |

\* cited by examiner

SEMICONDUCTOR PACKAGE

CROSS-REFERENCE TO RELATED APPLICATION

This U.S. nonprovisional application claims priority under 35 U.S.C. § 119 from Korean Patent Application No. 10-2021-0069883, filed on May 31, 2021 in the Korean Intellectual Property Office, the contents of which are herein incorporated by reference in their entirety.

BACKGROUND

Technical Field

Embodiments of the present inventive concepts are directed to a semiconductor package, and more particularly, to a semiconductor package that includes a redistribution substrate and a method of fabricating the same.

Discussion of the Related Art

A semiconductor package implements an integrated circuit chip for use in an electronic product. A semiconductor package is typically configured such that a semiconductor chip is mounted on a printed circuit board and bonding wires or bumps are used to electrically connect the semiconductor chip to the printed circuit board.

SUMMARY

Some embodiments of the present inventive concepts provide a semiconductor package with improved electrical characteristics and a method of fabricating the same.

According to some embodiments of the present inventive concepts, a semiconductor package includes: a first redistribution substrate; a semiconductor chip disposed on a top surface of the first redistribution substrate; a molding layer disposed on the first redistribution substrate, where the molding layer covers the semiconductor chip; a second redistribution substrate disposed on the molding layer, where the second redistribution substrate includes a dielectric layer, a redistribution pattern, and a conductive pad. The dielectric layer includes a lower opening that exposes the conductive pad, and an upper opening connected to the lower opening, where a width of the upper opening is greater than a width of the lower opening; and a redistribution pad disposed on the conductive pad, where the redistribution pad covers a sidewall of the lower opening and a bottom surface of the upper opening. A top surface of the dielectric layer is located at a higher level than a first top surface of the redistribution pad. The first top surface of the redistribution pad is located on the bottom surface of the upper opening.

According to some embodiments of the present inventive concepts, a semiconductor package includes: a first redistribution substrate; a semiconductor chip disposed on a top surface of the first redistribution substrate; a conductive structure disposed on the top surface of the first redistribution substrate and spaced apart from the semiconductor chip; a second redistribution substrate disposed on the semiconductor chip and the conductive structure, where the second redistribution substrate includes a dielectric layer and a conductive pad. The dielectric layer includes an opening that exposes a portion of the conductive pad; and a redistribution pad disposed on the conductive pad and in the opening. The dielectric layer includes: a first top surface located at a higher level than a top surface of the redistribution pad; and a second top surface located at a lower level than the first top surface and at a higher level than a top surface of the conductive pad. The redistribution pad includes: a seed pad disposed on the second top surface of the dielectric layer; and a bonding pad disposed on the seed pad.

According to some embodiments of the present inventive concepts, a semiconductor package includes: a first redistribution substrate including a first dielectric layer, a first seed pattern, and a first redistribution pattern; a solder ball on a bottom surface of the first redistribution substrate a semiconductor chip disposed on a top surface of the first redistribution substrate; a conductive structure disposed on the top surface of the first redistribution substrate and laterally spaced apart from the semiconductor chip; a molding layer disposed between the semiconductor chip and the conductive structure, where the molding layer covers the semiconductor chip; a second redistribution substrate disposed on the molding layer, where the second redistribution substrate includes a dielectric layer, a redistribution pattern, and a conductive pad; and a redistribution pad disposed on the conductive pad. The redistribution pad is electrically connected to the conductive structure through the conductive pad and the second redistribution pattern. The dielectric layer includes: a lower opening that exposes the conductive pad; and an upper opening connected to the lower opening, where a width of the upper opening is greater than a width of the lower opening. The redistribution pad covers a sidewall of the lower opening and a bottom surface of the upper opening. A first top surface of the redistribution pad is located on the bottom surface of the upper opening. A top surface of the dielectric layer is located at a higher level than the first top surface of the redistribution pad.

According to some embodiments of the present inventive concepts, a semiconductor package includes: a first redistribution substrate; a semiconductor chip disposed on a top surface of the first redistribution substrate; a conductive structure disposed on the top surface of the first redistribution substrate and laterally spaced apart from the semiconductor chip; a molding layer disposed between the semiconductor chip and the conductive structure, where the molding layer covers the semiconductor chip; a second redistribution substrate disposed on the molding layer, where the second redistribution substrate includes a dielectric layer, a redistribution pattern, and a conductive pad; and a redistribution pad disposed on the conductive pad and that is electrically connected to the conductive structure through the conductive pad and the redistribution pattern. The dielectric layer includes: a lower opening that exposes the conductive pad; and an upper opening connected to the lower opening, wherein a width of the upper opening is greater than a width of the lower opening. The redistribution pad includes: a seed pad that covers a sidewall of the lower opening and a bottom surface of the upper opening wherein the seed pad includes a first metal; and a connection bonding pad disposed on the seed pad. The connection bonding pad includes an intermetallic compound of a second metal, a third metal, and a solder material, the second metal differs from the first metal, and the third metal differs from the first metal and the second metal.

DETAILED DESCRIPTION

Figure 1A:
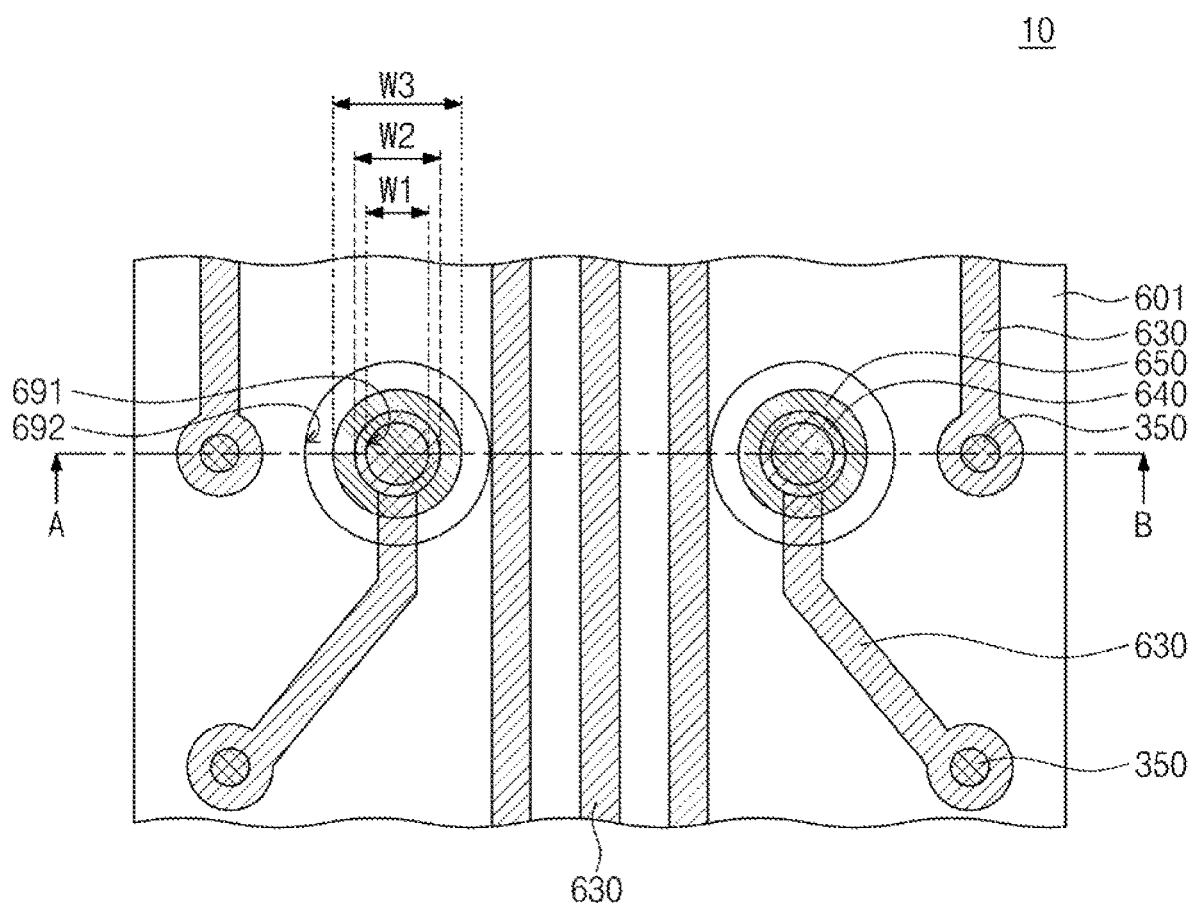
FIG. 1A is an enlarged plan view that partially shows a semiconductor package according to some embodiments.

In this description, like reference numerals may indicate like components. The following will now describe semiconductor packages and their fabricating methods according to some embodiments of the present inventive concepts.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1B:
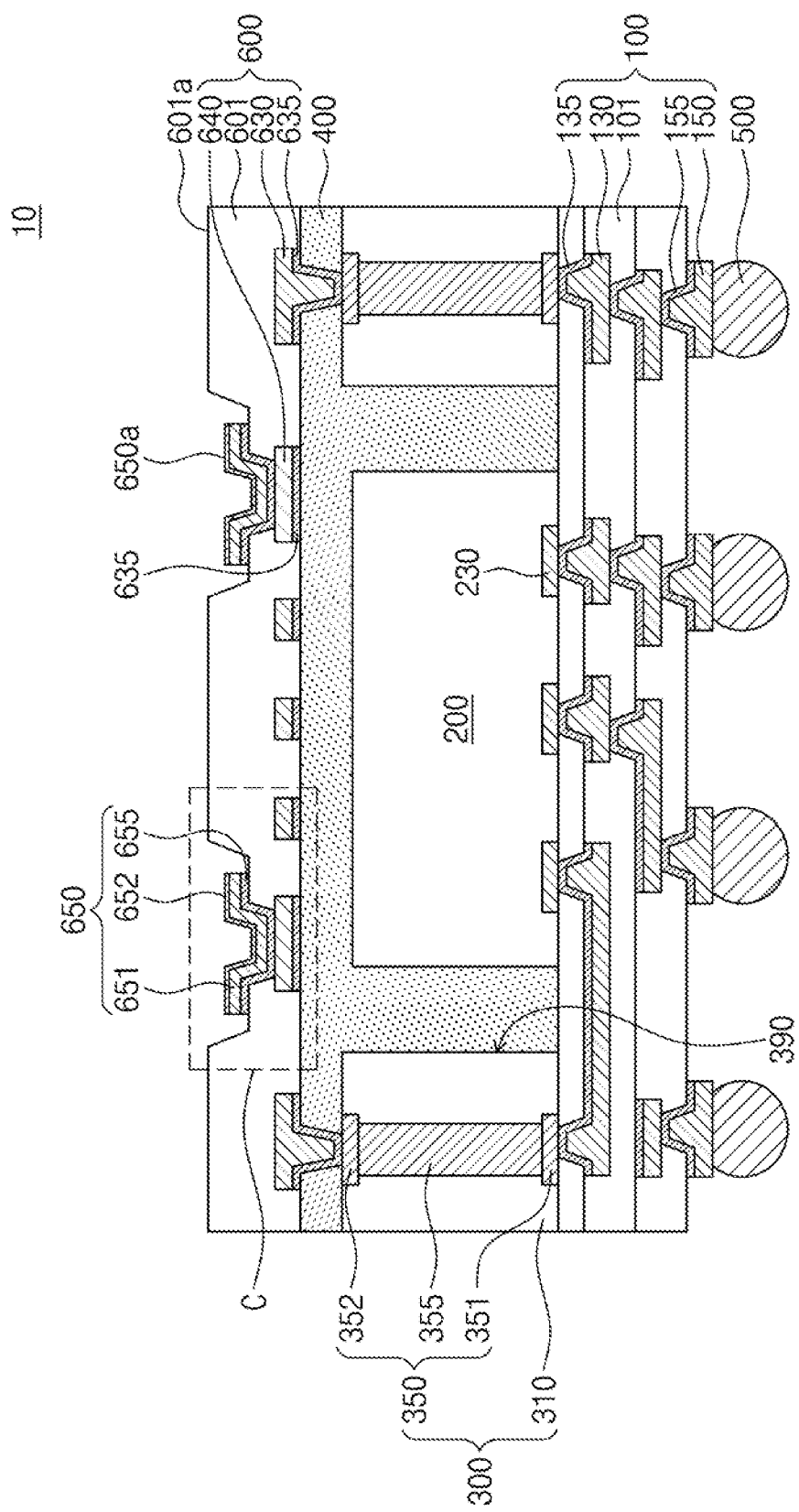
FIG. 1B is a cross-sectional view of a semiconductor package according to some embodiments.
Figure 1C:
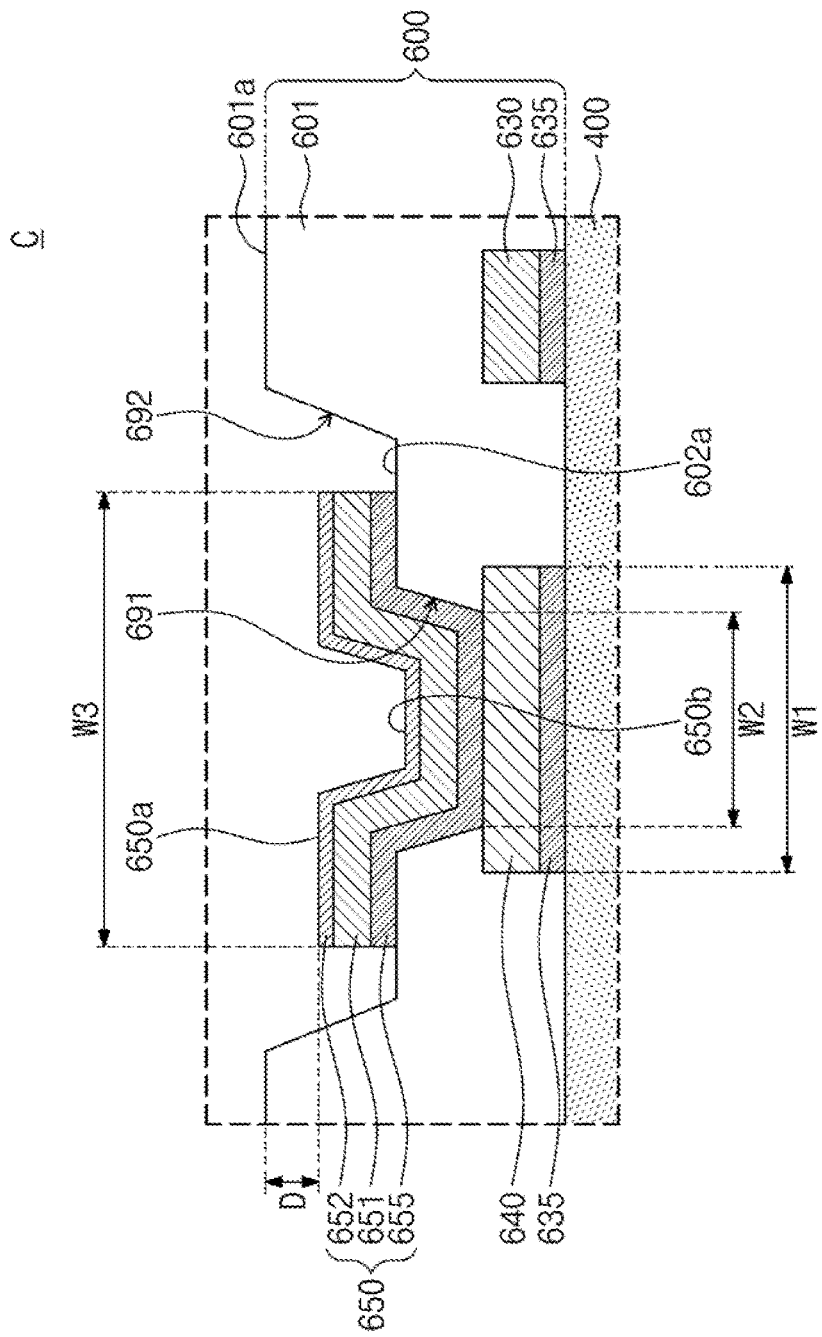
FIG. 1C is an enlarged view of section C of FIG. 1B.

FIG. 1A is an enlarged plan view of a portion of a semiconductor package according to some embodiments that shows a second redistribution substrate, a second redistribution pad, and a conductive structure. FIG. 1B is a cross-sectional view taken along line A-B of FIG. 1A that shows a semiconductor package according to some embodiments. FIG. 1C is an enlarged view of section C of FIG. 1B.

Referring to FIGS. 1A, 1B, and 1C, according to some embodiments, a semiconductor package 10 is a lower package. The semiconductor package 10 includes a first redistribution substrate 100, solder balls 500, a semiconductor chip 200, a connection substrate 300, a molding layer 400, a second redistribution substrate 600, and a second redistribution pad 650.

As illustrated in FIG. 1B, the semiconductor chip 200 is mounted on a top surface of the first redistribution substrate 100. When viewed in a plan view, the semiconductor chip 200 is disposed on a central region of the first redistribution substrate 100. The semiconductor chip 200 may be one of a logic chip, a buffer chip, and a memory chip. For example, the semiconductor chip 200 is a logic chip. The semiconductor chip 200 may include an application specific integrated circuit (ASIC) chip or an application processor (AP) chip. The ASIC chip may include an application specific integrated circuit (ASIC). Alternatively, the semiconductor chip 200 may include a central processing unit (CPU) or a graphic processing unit (GPU).

The semiconductor chip 200 has a top surface and a bottom surface that are opposite to each other. The bottom surface of the semiconductor chip 200 faces toward the first redistribution substrate 100. The semiconductor chip 200 includes a semiconductor substrate, integrated circuits, and chip pads 230. A top surface of the semiconductor substrate is an inactive surface or a rear surface. A bottom surface of the semiconductor substrate is an active surface or a front surface. The integrated circuits are provided on the bottom surface of the semiconductor substrate. The chip pads 230 are coupled to the integrated circuits. The phrase "a certain component is electrically connected to the semiconductor chip 200" means that "a certain component is electrically connected through the chip pads 230 to the integrated circuits of the semiconductor chip 200." The chip pads 230 include metal, such as aluminum or copper.

The connection substrate 300 is disposed on the top surface at an edge region of the first redistribution substrate 100. The connection substrate 300 has a substrate hole 390 that penetrates therethrough. For example, the connection substrate 300 can be manufactured by forming the substrate hole 390 that penetrates top and bottom surfaces of a printed circuit board. The semiconductor chip 200 is located in the substrate hole 390 of the connection substrate 300. The semiconductor chip 200 is spaced apart from an inner sidewall of the connection substrate 300.

The connection substrate 300 includes a base layer 310 and a conductive structure 350. The base layer 310 includes a dielectric material. The base layer 310 includes, for example, at least one of a carbon-based material, a ceramic, or a polymer. The conductive structure 350 is disposed in the base layer 310. The conductive structure 350 includes a first pad 351, a conductive via 355, and a second pad 352. The first pad 351 is disposed on a bottom surface of the base layer 310. The first pad 351 is exposed by a bottom surface of the base layer 310. The conductive via 355 is disposed on the first pad 351 and penetrates the base layer 310. The conductive via 355 is coupled to the first pad 351. The second pad 352 is disposed on and coupled to the conductive via 355. The second pad 352 is exposed by a top surface of the base layer 310. A top surface of the second pad 352 corresponds to that of the conductive structure 350. The conductive structure 350 includes metal. A plurality of conductive structure 350 may be provided, and the plurality of conductive structures 350 are electrically separated from each other. The conductive structures 350 include, for example, at least one of copper, aluminum, tungsten, titanium, tantalum, or iron, or any alloy thereof. The following will describe a single conductive structure 350.

The first redistribution substrate 100 includes a first dielectric layer 101, first redistribution patterns 130, first seed patterns 135, first redistribution pads 150 and first seed pads 155. The first dielectric layer 101 is disposed on the bottom surface of the semiconductor chip 200 and on the bottom surface of the connection substrate 300, thereby covering the bottom surface of the semiconductor chip 200 and the bottom surface of the connection substrate 300. The first dielectric layer 101 includes an organic material, such as a photo-imagable dielectric (PID) material. The photo-imagable dielectric material includes, for example, at least one of a photosensitive polyimide, polybenzoxazole, a phenolic polymer, or a benzocyclobutene polymer. A plurality of first dielectric layers 101 are provided. The number of stacked first dielectric layers 101 can vary. Each of the plurality of first dielectric layers 101 may include the same material. An instinct interface is provided between neighboring first dielectric layers 101.

The first redistribution patterns 130 are disposed in the first dielectric layers 101. The first redistribution patterns 130 are laterally spaced apart and electrically separated from each other. The phrase "two components are laterally spaced apart from each other" means that "two components are horizontally spaced apart from each other." The term "horizontally" means "parallel to a bottom surface of the first redistribution substrate 100." The bottom surface of the first redistribution substrate 100 is a bottom surface of a lowermost first dielectric layer 101. The first redistribution patterns 130 include a metal, such as copper. The phrase "electrically connected to the first redistribution substrate 100" means "electrically connected to at least one of the first redistribution patterns 130."

Each of the first redistribution patterns 130 includes a first via part and a first wire part. In this description, a via part of a certain component is a vertical connection segment, and a wire part of a certain component is a horizontal connection segment. The term "vertically/perpendicularly" means "vertical or perpendicular to the bottom surface of the first redistribution substrate 100." The first via part is disposed in a corresponding first dielectric layer 101 and on a bottom surface of a corresponding first dielectric layer 101. The first wire part is disposed on one side of a lower portion of the first via part, and the first wire part and the first via part are connected to each other with no boundary therebetween. In other words, the first wire part and the first via part are integrally formed.

The first redistribution patterns 130 include a lower redistribution pattern and an upper redistribution pattern. The upper redistribution pattern is disposed on and coupled to the lower redistribution pattern. The first via part of each of uppermost first redistribution patterns 130 is disposed on a bottom surface of a corresponding chip pad 230 in the semiconductor chip 200.

The first seed patterns 135 are correspondingly disposed on top surfaces of the first redistribution patterns 130. For example, each of the first seed patterns 135 covers a top surface and a sidewall of the first via part in a corresponding first redistribution pattern 130, and also covers a top surface of the first wire part in a corresponding first redistribution pattern 130. The uppermost first seed patterns 135 are correspondingly interposed between the chip pads 230 and the uppermost first redistribution patterns 130. The uppermost first seed patterns 135 are in direct contact with the chip pads 230. The chip pads 230 are electrically connected through the uppermost first seed patterns 135 to the first redistribution patterns 130. The first seed patterns 135 include a material that differs from that of the chip pads 230 and that of the first redistribution patterns 130. For example, the first seed patterns 135 include a conductive seed material. The conductive seed material includes one or more of copper or titanium, or any alloy thereof. The first seed patterns 135 are barrier layers that prevent diffusion of materials included in the first redistribution patterns 130.

The first redistribution pads 150 are disposed on bottom surfaces of the lowermost first redistribution patterns 130, and are correspondingly coupled to the lowermost first redistribution patterns 130. The first redistribution pads 150 are laterally spaced apart from each other.

The first seed pads 155 are disposed on top surfaces of the first redistribution pads 150. For example, the first seed pads 155 are correspondingly disposed between the lowermost first redistribution patterns 130 and the first redistribution pads 150, and correspondingly extend between the lowermost first dielectric layer 101 and the first redistribution pads 150. For another example, the first seed pads 155 are disposed between two stacked first redistribution patterns 130. The first seed pads 155 include a material that differs from that of the first redistribution patterns 130 and that of the first redistribution pads 150. The first seed pads 155 include, for example, a conductive seed material.

The solder balls 500 are disposed on the bottom surface of the first redistribution substrate 100. For example, the solder balls 500 are correspondingly disposed on bottom surfaces of the first redistribution pads 150, and are correspondingly coupled to the first redistribution pads 150. The solder balls 500 are electrically connected through the first redistribution patterns 130 to the chip pads 230 and the first pads 351. The solder balls 500 are electrically separated from each other. The solder balls 500 include a solder material. The solder material includes, for example, at least one of tin, bismuth, lead, or silver, or any alloy thereof. As the first redistribution patterns 130 are provided, at least one of the solder balls 500 might not be vertically aligned with one of the chip pad 230 or the first pad 351 that are electrically connected to the solder ball 500.

The molding layer 400 is disposed on the top surface of the first redistribution substrate 100 and covers the semiconductor chip 200 and the connection substrate 300. The molding layer 400 is interposed between the semiconductor chip 200 and the connection substrate 300. According to some embodiments, the molding layer 400 includes an adhesive dielectric film, such as an Ajinomoto build-up film (ABF). Alternatively, in other embodiments, the molding layer 400 includes a dielectric polymer, such as an epoxy-based polymer.

The second redistribution substrate 600 is disposed on the molding layer 400 and the connection substrate 300. The second redistribution substrate 600 includes a second dielectric layer 601, second redistribution patterns 630, second seed patterns 635, and conductive pads 640. The second redistribution substrate 600 has an outer sidewall aligned with that of the molding layer 400 and that of the first redistribution substrate 100. The second redistribution substrate 600 is electrically connected to the conductive structure 350. The phrase "electrically connected to the second redistribution substrate 600" means "electrically connected to at least one of the second redistribution patterns 630."

The second redistribution patterns 630 are disposed in the second dielectric layer 601. The second redistribution patterns 630 are laterally spaced apart and electrically separated from each other. Each of the second redistribution patterns 630 includes a second via part and a second wire part. The second via part is disposed in the second dielectric layer 601. The second via part of each of the second redistribution patterns 630 are disposed on the top surface of the conductive structure 350 that corresponds thereto. For example, the second via part of each of the second redistribution patterns 630 vertically overlaps the second pad 352. As shown in FIG. 1A, the second via part of each of the second redistribution patterns 630 has a circular shape when viewed in a plan view. As shown in FIG. 1B, the second wire part of each of the second redistribution patterns 630 is disposed on one side at an upper portion of the second via part, and the second wire part and the second via part are connected to each other with no boundary therebetween. That is, the second wire part and the second via part are integrally formed. The second wire part of each of the second redistribution patterns 630 is disposed on a top surface of the second dielectric layer 601 that corresponds thereto. The second redistribution patterns 630 include a metal, such as copper.

The conductive pads 640 are disposed on a top surface of the molding layer 400. As shown in FIG. 1A, the conductive pad 640 is connected to at least one of the second redistribution patterns 630. The conductive pad 640 has a first width W1. The first width W1 of the conductive pad 640 is greater than a width of the second wire part of the second redistribution pattern 630 that is electrically connected to the conductive pad 640. The conductive pad 640 is laterally spaced apart from those second redistribution patterns 630 that are not electrically connected thereto. The conductive pad 640 includes the same material as the second redistribution patterns 630 and has the same thickness as the second redistribution patterns 630.

The second seed patterns 635 are disposed on bottom surfaces of the second redistribution patterns 630 and on bottom surfaces of the conductive pads 640. The second seed patterns 635 extend between the molding layer 400 and the second redistribution patterns 630 and between the connection substrate 300 and the second redistribution patterns 630. At least one of the second seed patterns 635 is in contact with the second pad 352. The second seed patterns 635 are laterally spaced apart and electrically separated from each other. The second seed patterns 635 include a material that differs from that of the second redistribution patterns 630 and from that of the conductive pads 640. For example, the second seed patterns 635 include titanium or a titanium-copper alloy. In this case, the second seed patterns 635 are barrier layers that prevent diffusion of materials in the second redistribution patterns 630. For another example, the second seed patterns 635 may a same material as the second redistribution patterns 630 and the conductive pads 640. In this case, there is an indistinct interface between the second seed pattern 635 and the second redistribution pattern 630 and between the conductive pad 640 and the second seed pattern 635. Embodiments of the present inventive concepts, however, are not limited thereto.

The second dielectric layer 601 that covers the second redistribution patterns 630 and the conductive pads 640 is disposed on the molding layer 400. Referring to FIGS. 1B and 1C, the second dielectric layer 601 has a first top surface 601a and a second top surface 602a. The second dielectric layer 601 has a lower opening 691 and an upper opening 692. The upper opening 692 penetrates the first top surface 601a of the second dielectric layer 601. The upper opening 692 has a bottom surface formed in the second dielectric layer 601. The bottom surface of the upper opening 692 is the second top surface 602a of the second dielectric layer 601. The second top surface 602a of the second dielectric layer 601 is located at a lower level lower from the first top surface 601a and at higher level than a top surface of the conductive pad 640.

The lower opening 691 is formed in a lower portion of the second dielectric layer 601 and penetrates the second top surface 602a of the second dielectric layer 601. The lower opening 691 is spatially connected to the upper opening 692. The lower opening 691 is contained within the upper opening 692. The lower opening 691 partially exposes the top surface of the conductive pad 640. The lower opening 691 has a second width W2 on the top surface of the conductive pad 640. The second width W2 is a width at a bottom surface of the lower opening 691. The upper opening 692 has a width greater than the second width W2. In this case, the width of the upper opening 692 is a width at the bottom surface of the upper opening 692. The second width W2 is substantially the same as a width of the exposed portion of the top surface of the conductive pad 640. The second width W2 ranges from about 10 μm to about 150 μm. The second width W2 is less than the first width W1. A difference between the second width W2 and the first width W1 ranges from about 5 μm to about 30 μm. If the difference between the second width W2 and the first width W1 is equal to or greater than about 5 μm, the lower opening 691 can expose the conductive pad 640 even when a process error occurs when forming the lower opening 691. If the difference between the second width W2 and the first width W1 is equal to or less than about 30 μm, neither the lower opening 691 nor the conductive pad 640 have an effect on the arrangement of the second redistribution patterns 630. A lower limit may be placed on the number of the second redistribution patterns 630, and a fine pitch is provided between the second redistribution patterns 630.

The second redistribution pad 650 is disposed on the conductive pad 640. The second redistribution pad 650 is electrically connected to the semiconductor chip 200 through the conductive pad 640, the second redistribution pattern 630, the conductive structure 350, and the first redistribution substrate 100. Alternatively, in other embodiments, the second redistribution pad 650 is electrically connected to one of the solder balls through the second redistribution substrate 600 and the conductive structure 350. The second redistribution pad 650 includes a second seed pad 655 and a bonding pad. The bonding pad includes a first bonding pad 651 and a second bonding pad 652. The second seed pad 655 is disposed on the exposed top surface of the conductive pad 640, and covers a lateral surface of the lower opening 691 and at least a portion of the bottom surface of the upper opening 692. For example, the second seed pad 655 partially covers the second top surface 602a of the second dielectric layer 601. The second seed pad 655 does not extend onto the first top surface 601a of the second dielectric layer 601. The second seed pad 655 includes a first metal. The first metal is a material that differs from that of the conductive pad 640. For example, the first metal includes titanium or an alloy of titanium and copper. In this case, the second seed pad 655 is a barrier layer. Alternatively, in other embodiments, the first metal includes a same material as the conductive pad 640. For example, the first metal includes copper. In this case, there is an instinct interface between the second seed pad 655 and the conductive pad 640.

The first bonding pad 651 lies on and covers the second seed pad 655. The first bonding pad 651 is an adhesion layer. The first bonding pad 651 includes a second metal. The second metal differs from the first metal. For example, the second metal includes nickel.

The second bonding pad 652 is disposed on the first bonding pad 651. The second bonding pad 652 includes a third metal. The third metal differs from the first metal and the second metal. For example, the third metal includes gold (Au). The second bonding pad 652 is a protection layer that prevents damage to the second redistribution pad 650, such as oxidation. The second bonding pad 652 is stably attached through the first bonding pad 651 to the second seed pad 655. The second redistribution pad 650 has a top surface that corresponds to that of the second bonding pad 652.

When the second redistribution pad 650 does not include the second seed pad 655, a plating bar is further provided. The plating bar is formed at the same level as the second redistribution patterns 630, and is used in a plating process that forms the second redistribution pad 650. In this case, the plating bar reduces an area where the second redistribution patterns 630 are arranged. According to some embodiments, the second redistribution pad 650 includes the second seed pad 655, and thus no plating bar is separately provided. Therefore, the second redistribution patterns 630 are provided with free displacement and an increased area for their arrangement. Accordingly, the semiconductor package 10 has increased electrical properties.

Since the second redistribution patterns 630 have an increased area for their arrangement, a lower limit is placed on the number of the second redistribution patterns 630. For example, a large number of the second redistribution patterns 630 are disposed on the same level, which reduces the need to stack the second redistribution patterns 630. As a result, the semiconductor package 10 can be simply fabricated with a reduced size.

When the conductive pad 640 and the plating bar are used as a seed layer to form the second redistribution pads 650, the conductive pad 640 has a planar area greater than that of the second redistribution pad 650. According to some embodiments, if the second seed pad 655 is used to form the second redistribution pad 650, the second redistribution pad 650 has a width W3 that does not depend on the first width W1 of the conductive pad 640. Therefore, the width W3 of the second redistribution pad 650 does not depend on the first width W1 of the conductive pad 640. For example, the width W3 of the second redistribution pad 650 is greater than the first width W1 and the second width W2. The first width W1 is relatively small, and thus there is an increased area where the second redistribution patterns 630 can be disposed. Thus, an arrangement of the second redistribution patterns 630 can be freely designed.

Figure 3A:
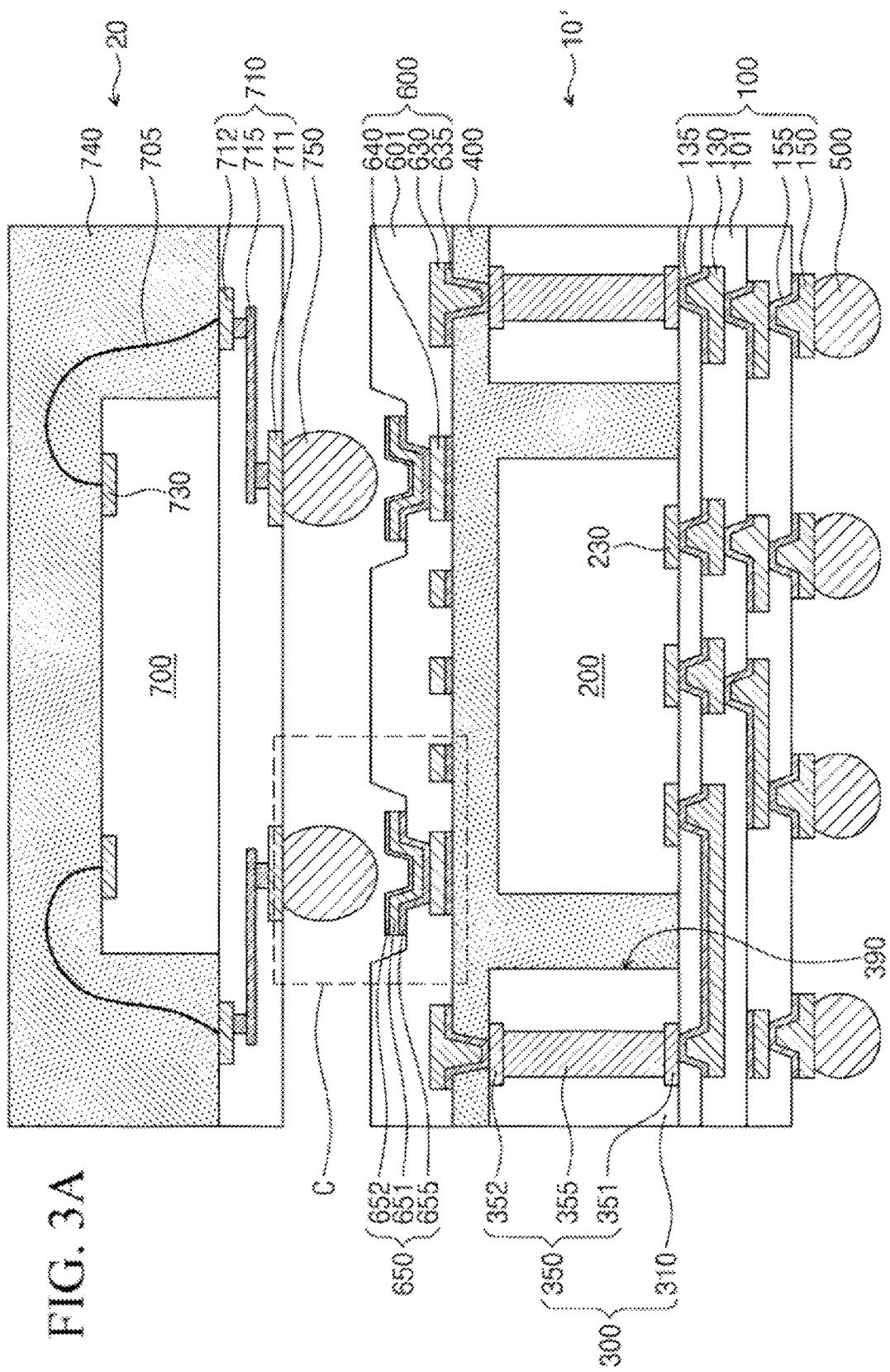
FIG. 3A is a cross-sectional view that illustrates a procedure for connecting a lower package and an upper package to each other.

The second redistribution pad 650 substantially conformally cover the top surface of the conductive pad 640, the lateral surface of the lower opening 691, and the bottom surface of the upper opening 692, thereby having a stepped shape. For example, the top surface of the second redistribution pad 650 includes a first top surface 650a and a second top surface 650b. The second top surface 650b of the second redistribution pad 650 is a top surface of the second redistribution pad 650 on the conductive pad 640. The first top surface 650a of the second redistribution pad 650 is a top surface of the second redistribution pad 650 on the second top surface 602a of the second dielectric layer 601. The first top surface 650a of the second redistribution pad 650 is located at a higher level than the second top surface 650b of the second redistribution pad 650. The first top surface 650a of the second redistribution pad 650 is an uppermost surface of the second redistribution pad 650. The first top surface 650a of the second redistribution pad 650 is located at a lower level from the first top surface 601a of the second dielectric layer 601. Therefore, the second redistribution pad 650 can be prevented from being damaged by external objects. A level difference D between the first top surface 650a of the second redistribution pad 650 and the first top surface 601a of the second dielectric layer 601 ranges from about 0.1 μm to about 20 μm. If the level difference D between the first top surface 650a of the second redistribution pad 650 and the first top surface 601a of the second dielectric layer 601 is equal to or greater than about 0.1 μm, the second dielectric layer 601 can prevent damage to the second redistribution pad 650. If the level difference D between the first top surface 650a of the second redistribution pad 650 and the first top surface 601a of the second dielectric layer 601 is equal to or less than about 20 μm, a connection solder ball 750, which will be described with reference to FIG. 3A, is coupled to the second redistribution pad 650.

Figure 2A:
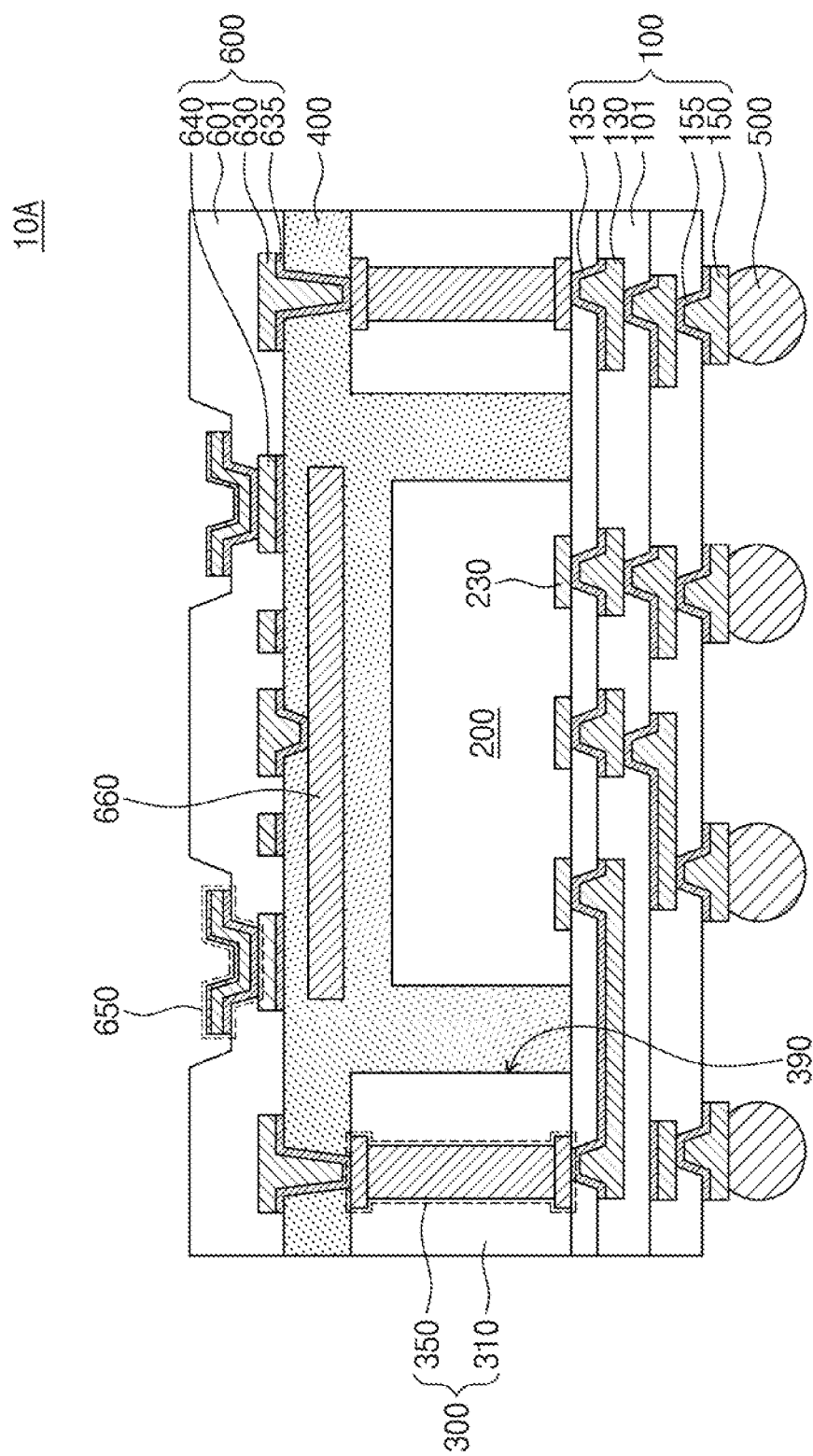
FIG. 2A is a cross-sectional view of a semiconductor package according to some embodiments.

FIG. 2A is a cross-sectional view of a semiconductor package according to some embodiments. A duplicate description of components described with reference to FIGS. 1A-C will be omitted below.

Referring to FIG. 2A, according to some embodiments, a semiconductor package 10A is a lower package. The semiconductor package 10A includes a first redistribution substrate 100, solder balls 500, a semiconductor chip 200, a connection substrate 300, a molding layer 400, a second redistribution substrate 600, a second redistribution pad 650, and a conductive layer 660.

The conductive layer 660 is disposed between the semiconductor chip 200 and the second redistribution substrate 600 and is surrounded by the molding layer 400. The conductive layer 660 is disposed in the molding layer 400. The conductive layer 660 vertically overlaps at least a portion of the semiconductor chip 200 and does not vertically overlap the connection substrate 300. At least one of the second redistribution patterns 630 is disposed on and electrically connected to the conductive layer 660. The conductive layer 660 is electrically separated from the second redistribution pad 650. In addition, the conductive layer 660 is coupled to a corresponding conductive structure 350 through the second redistribution pattern 630. Therefore, the conductive layer 660 is supplied with a ground or power voltage. The conductive layer 660 shields electromagnetic interference (EMI) of the semiconductor chip 200. The conductive layer 660 prevents electrical damage to the semiconductor chip 200 caused by an electromagnetic discharge (ESD). The conductive layer 660 prevents electrical signal interference between conductive components. The conductive components include integrated circuits of the semiconductor chip 200, the second redistribution pattern 630, or the second redistribution pad 650, but embodiments of the present inventive concepts are not limited thereto.

Figure 2B:
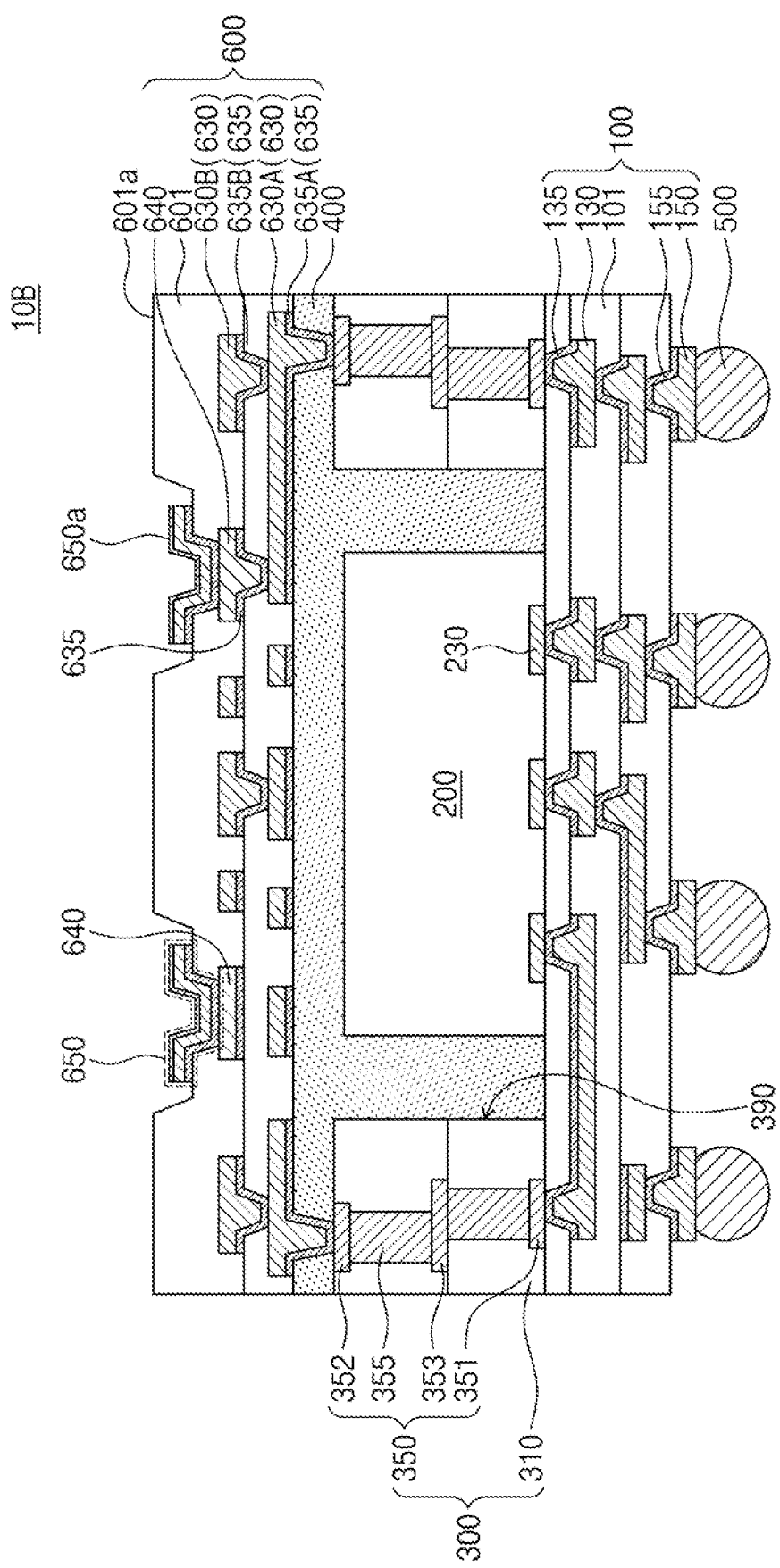
FIG. 2B is a cross-sectional view of a semiconductor package according to some embodiments.

FIG. 2B is a cross-sectional view of a semiconductor package according to some embodiments. A duplicate description of components described with reference to FIGS. 1A-C will be omitted below.

Referring to FIG. 2B, in some embodiments, a semiconductor package 10B is a lower package. The semiconductor package 10A includes a first redistribution substrate 100, solder balls 500, a semiconductor chip 200, a connection substrate 300, a molding layer 400, a second redistribution substrate 600, and a second redistribution pad 650.

The connection substrate 300 includes a plurality of base layers 310 and a conductive structure 350. Each of the base layers 310 is substantially the same as that described with reference to FIG. 1B. The conductive structure 350 includes a first pad 351, a second pad 352, a plurality of conductive vias 355, and a conductive pattern 353. The conductive vias 355 penetrate corresponding base layers 310. The conductive pattern 353 is interposed between and coupled to the conductive vias 355. The second pad 352 is coupled to the first pad 351 through the conductive vias 355 and the conductive pattern 353.

The second redistribution substrate 600 includes second redistribution patterns 630, a conductive pad 640, second seed patterns 635, and a second dielectric layer 601. The second dielectric layer 601 includes a plurality of stacked layers. For example, the stacked layers of the second dielectric layer 601 include the same material as each other. An instinct interface is provided between the stacked layers of the second dielectric layer, but embodiments of the present inventive concepts are not limited thereto.

The second redistribution patterns 630 include second lower redistribution patterns 630A and second upper redistribution patterns 630B. The second lower redistribution patterns 630A are disposed on the molding layer 400. The second via part of each of the second lower redistribution patterns 630A extends into the molding layer 400 and is coupled to a corresponding second pad 352. The second lower redistribution patterns 630A are laterally spaced apart from each other. The second upper redistribution patterns 630B are disposed on and coupled to the second lower redistribution patterns 630A. The conductive pad 640 is coupled to a corresponding conductive structure 350 through at least one of the second lower redistribution patterns 630A. The conductive pad 640 is laterally spaced apart from those second lower redistribution patterns 630A that are not electrically connected thereto.

The second seed patterns 635 include second lower seed patterns 635A and second upper seed patterns 635B. The second lower seed patterns 635A are correspondingly disposed on bottom surfaces of the second lower redistribution patterns 630A. The second upper seed patterns 635B are disposed on bottom surfaces of the second upper redistribution patterns 630B and bottom surfaces of the conductive pads 640.

Figure 2C:
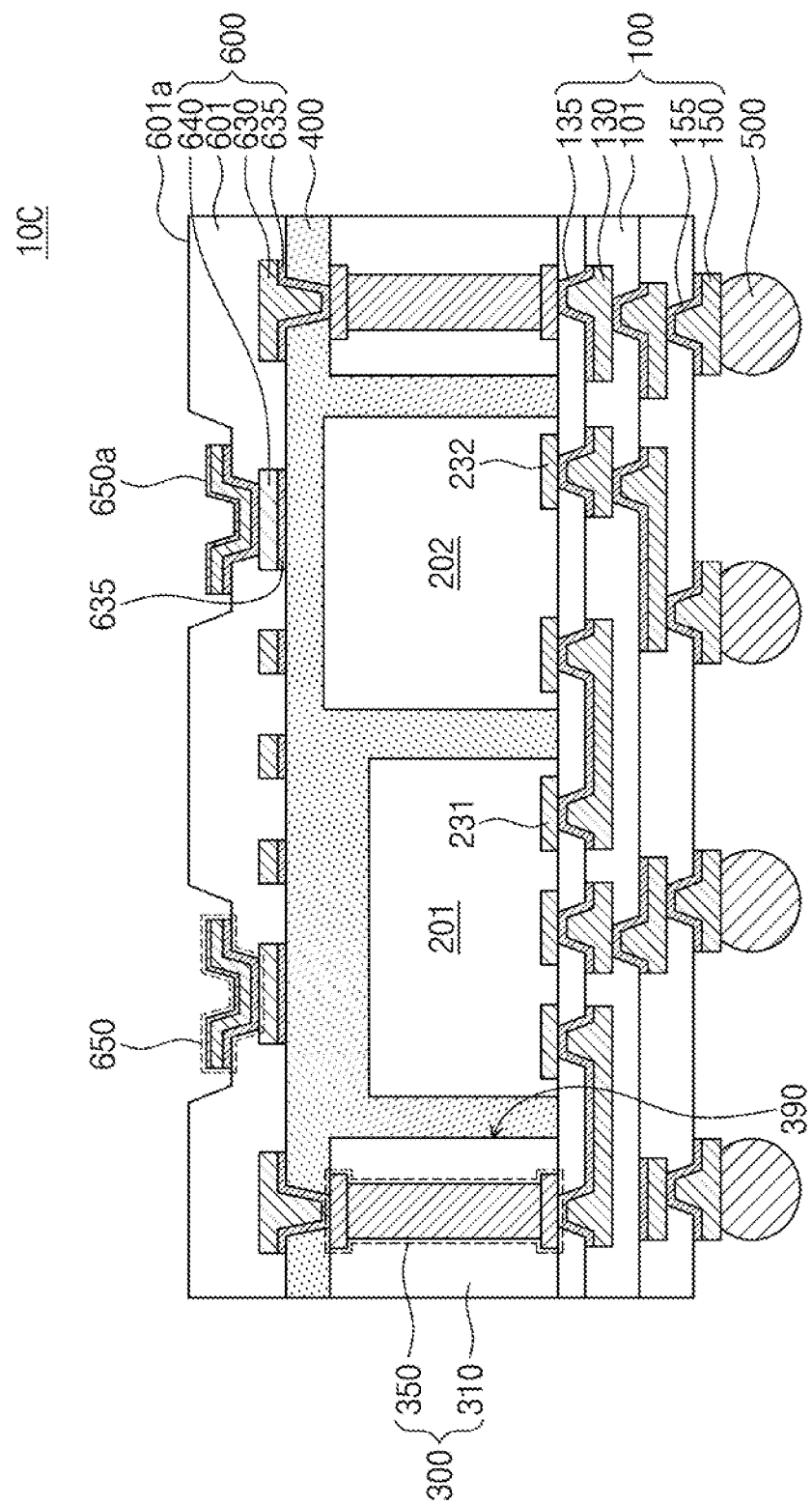
FIG. 2C is a cross-sectional view of a semiconductor package according to some embodiments.

FIG. 2C illustrates a cross-sectional view of a semiconductor package according to some embodiments. A duplicate description of components described with reference to FIGS. 1A-C will be omitted below.

Referring to FIG. 2C, in some embodiments, a semiconductor package 10C is a lower package. The semiconductor package 10C includes a first redistribution substrate 100, solder balls 500, a first semiconductor chip 201, a second semiconductor chip 202, a connection substrate 300, a molding layer 400, a second redistribution substrate 600, and a second redistribution pad 650.

Each of the first and second semiconductor chips 201 and 202 is substantially the same as the semiconductor chip 200 described with reference to FIGS. 1A and 1B. The first and second semiconductor chips 201 and 202 are each provided in the substrate hole 390 of the connection substrate 300. The second semiconductor chip 202 is laterally spaced apart from the first semiconductor chip 201. The second semiconductor chip 202 may be of a different type from the first semiconductor chip 201. For example, the first semiconductor chip 201 is a logic chip, and the second semiconductor chip 202 is a power management chip. The power management chip includes a power management integrated circuit (PMIC). The number of chip pads 232 in the second semiconductor chip 202 differs from that of chip pads 231 in the first semiconductor chip 201. A size of the second semiconductor chip 202 differs from that of the first semiconductor chip 201.

The first redistribution substrate 100 is disposed on a bottom surface of the first semiconductor chip 201, a bottom surface of the second semiconductor chip 202, and a bottom surface of the connection substrate 300. An uppermost first dielectric layer 101 is in direct contact with the bottom surface of the first semiconductor chip 201 and with the bottom surface of the second semiconductor chip 202. Uppermost first redistribution patterns 130 are coupled to the chip pads 231 of the first semiconductor chip 201 and to the chip pads 232 of the second semiconductor chip 202. The first semiconductor chip 201 is electrically connected through the first redistribution patterns 130 to the second semiconductor chip 202.

The molding layer 400 is disposed on the first redistribution substrate 100 and covers the first semiconductor chip 201 and the second semiconductor chip 202. The second redistribution pad 650 is electrically connected through the second redistribution substrate 600 and the conductive structure 350 to the first semiconductor chip 201 or the second semiconductor chip 202.

Figure 2D:
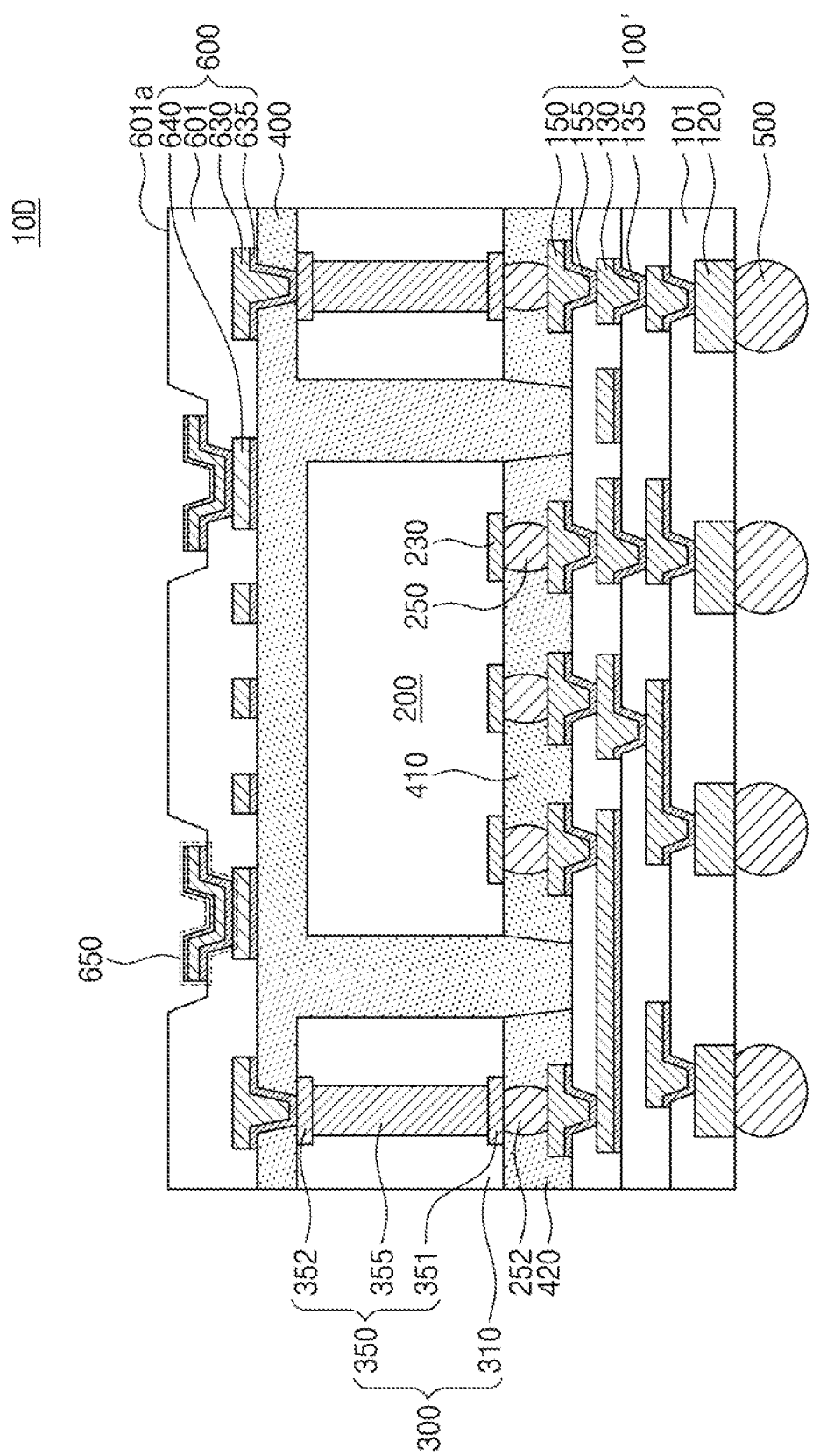
FIG. 2D is a cross-sectional view of a semiconductor package according to some embodiments.

FIG. 2D is a cross-sectional view of a semiconductor package according to some embodiments. A duplicate description of components described with reference to FIGS. 1A-C will be omitted below.

Referring to FIG. 2D, in some embodiments, a semiconductor package 10D is a lower package. The semiconductor package 10D includes a first redistribution substrate 100', solder balls 500, a semiconductor chip 200, a connection substrate 300, a molding layer 400, a second redistribution substrate 600, and a second redistribution pad 650. The first redistribution substrate 100' includes first dielectric layers 101, under-bump patterns 120, first redistribution patterns 130, first seed patterns 135, first seed pads 155, and first redistribution pads 150.

The under-bump patterns 120 are disposed in a lowermost first dielectric layer 101. The lowermost first dielectric layer 101 cover top surfaces and sidewalls of the under-bump patterns 120. Bottom surfaces of the under-bump patterns 120 are exposed by the lowermost first dielectric layer 101. The solder balls 500 are disposed on the bottom surfaces of the under-bump patterns 120 and are electrically connected to the under-bump patterns 120. The under-bump patterns 120 are laterally spaced apart and electrically insulated from each other. The under-bump patterns 120 include a metallic material, such as copper.

The first redistribution patterns 130 are similar to those described with reference to FIGS. 1B and 1C. The first redistribution patterns 130 are disposed on and electrically connected to corresponding under-bump patterns 120. The first wire part of each of the first redistribution patterns 130 is disposed on one side at an upper portion of the first via part and is connected to the first via part. The first seed patterns 135 are correspondingly disposed on bottom surfaces of the first redistribution patterns 130.

The first redistribution pads 150 are correspondingly disposed on uppermost first redistribution patterns 130. The first seed pads 155 are interposed between the first redistribution patterns 130 and bottom surfaces of the first redistribution pads 150, and extend between the first redistribution pads 150 and an uppermost first dielectric layer 101.

The semiconductor package 10D further includes first bumps 250 and second bumps 252. The first bumps 250 are interposed between the first redistribution substrate 100' and the semiconductor chip 200, and are correspondingly coupled to the first redistribution pads 150 and the chip pads 230 of the semiconductor chip 200. Therefore, the semiconductor chip 200 is coupled through the first bumps 250 to the first redistribution substrate 100'. The first bumps 250 include solder balls. The first bumps 250 further include pillar patterns, and the pillar patterns include a metal, such as copper. In this case, the pillar patterns are in contact with the chip pads 230.

The semiconductor package 10D further includes a first under-fill layer 410. The first under-fill layer 410 is disposed in a gap between the first redistribution substrate 100' and the semiconductor chip 200, and covers sidewalls of the first bumps 250. In other words, the first bumps 250 are embedded in the first under-fill layer 410. The first under-fill layer 410 includes a dielectric polymer, such as an epoxy-based polymer.

The second bumps 252 are interposed between the first redistribution substrate 100' and the connection substrate 300. For example, the second bumps 252 are coupled to corresponding first redistribution pads 150 and corresponding first pads 351. Therefore, the second redistribution pad 650 is coupled to the first redistribution substrate 100' through the second redistribution substrate 600, the conductive structure 350, and the second bump 252. The second bumps 252 include solder balls. The second bumps 252 further include pillar patterns that include a metal, such as copper. In this case, the pillar patterns are in contact with the first pad 351.

The semiconductor package 10D further includes a second under-fill layer 420. The second under-fill layer 420 is interposed between the first redistribution substrate 100' and the connection substrate 300, thereby sealing the second bumps 252. In other words, the second bumps 252 are embedded in the second under-fill layer 420. The second under-fill layer 420 includes a dielectric polymer, such as an epoxy-based polymer.

Figure 2E:
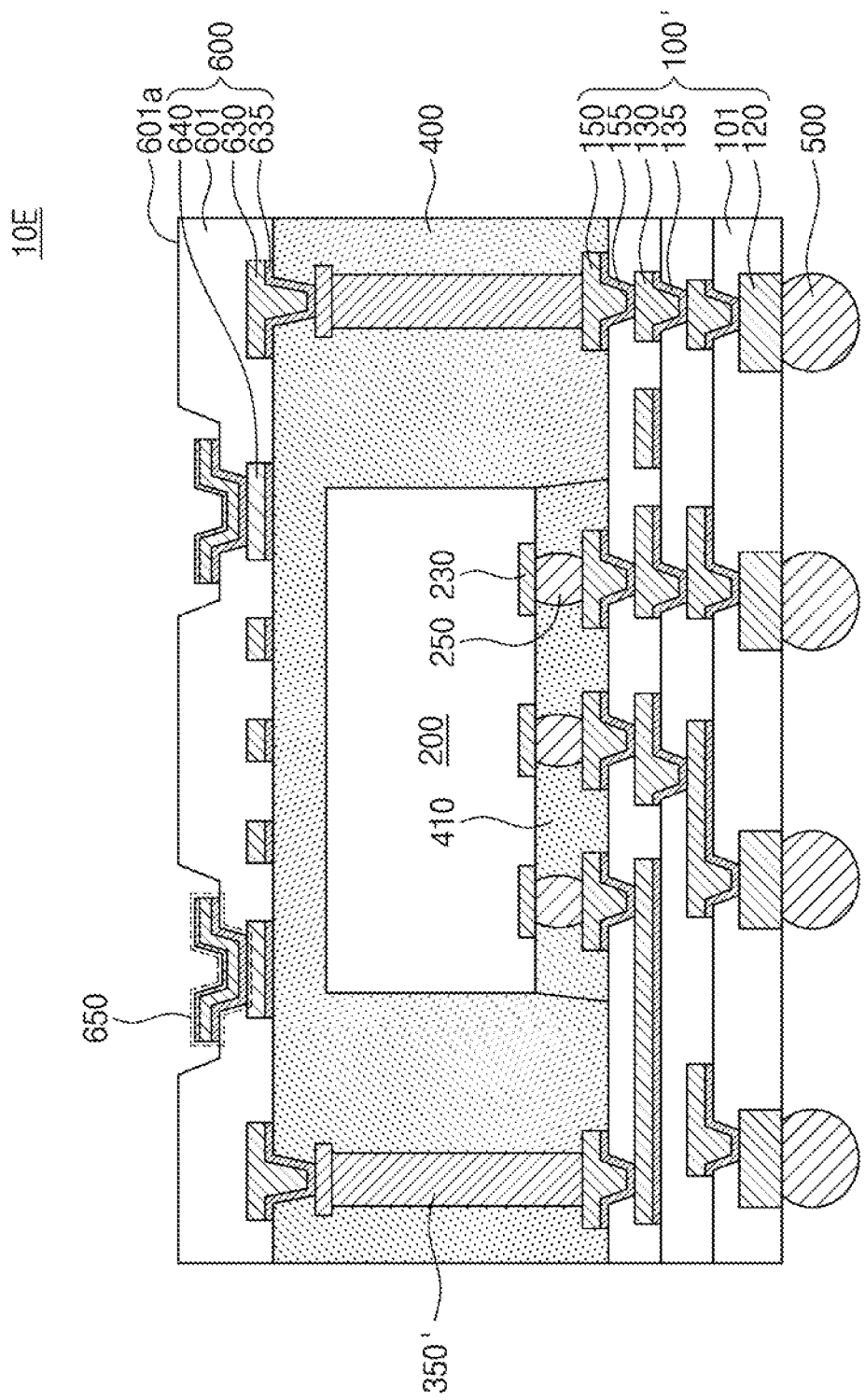
FIG. 2E is a cross-sectional view of a semiconductor package according to some embodiments.

FIG. 2E is a cross-sectional view of a semiconductor package according to some embodiments. A duplicate description of components described with reference to FIGS. 1A-C will be omitted below.

Referring to FIG. 2E, in some embodiments, a semiconductor package 10E is a lower package. The semiconductor package 10E includes a first redistribution substrate 100', solder balls 500, a semiconductor chip 200, a conductive structure 350', a molding layer 400, a second redistribution substrate 600, and a second redistribution pad 650. The first redistribution substrate 100' may be substantially the same as that discussed in FIG. 2D.

The connection substrate 300 described with reference to FIG. 1B is omitted. A metal pillar that forms the conductive structure 350' is disposed on the first redistribution substrate 100'. For example, the conductive structure 350' is a metal pillar. The conductive structure 350' is disposed on a top surface at an edge region of the first redistribution substrate 100' and is coupled to a corresponding first redistribution pad 150. The conductive structure 350' is laterally spaced apart from the semiconductor chip 200. The conductive structures 350' includes a metal, such as copper.

The molding layer 400 is disposed on a top surface of the first redistribution substrate 100' and between the semiconductor chip 200 and the conductive structure 350'. The molding layer 400 encapsulates a sidewall of the conductive structure 350' and exposes a top surface of the conductive structure 350'. The molding layer 400 has a top surface at a higher level than the top surface of the conductive structure 350'.

The second via part of each second redistribution pattern 630 is disposed on the top surface of the conductive structure 350'. The second redistribution pattern 630 is electrically connected to the exposed top surface of the conductive structure 350'.

Figure 3B:
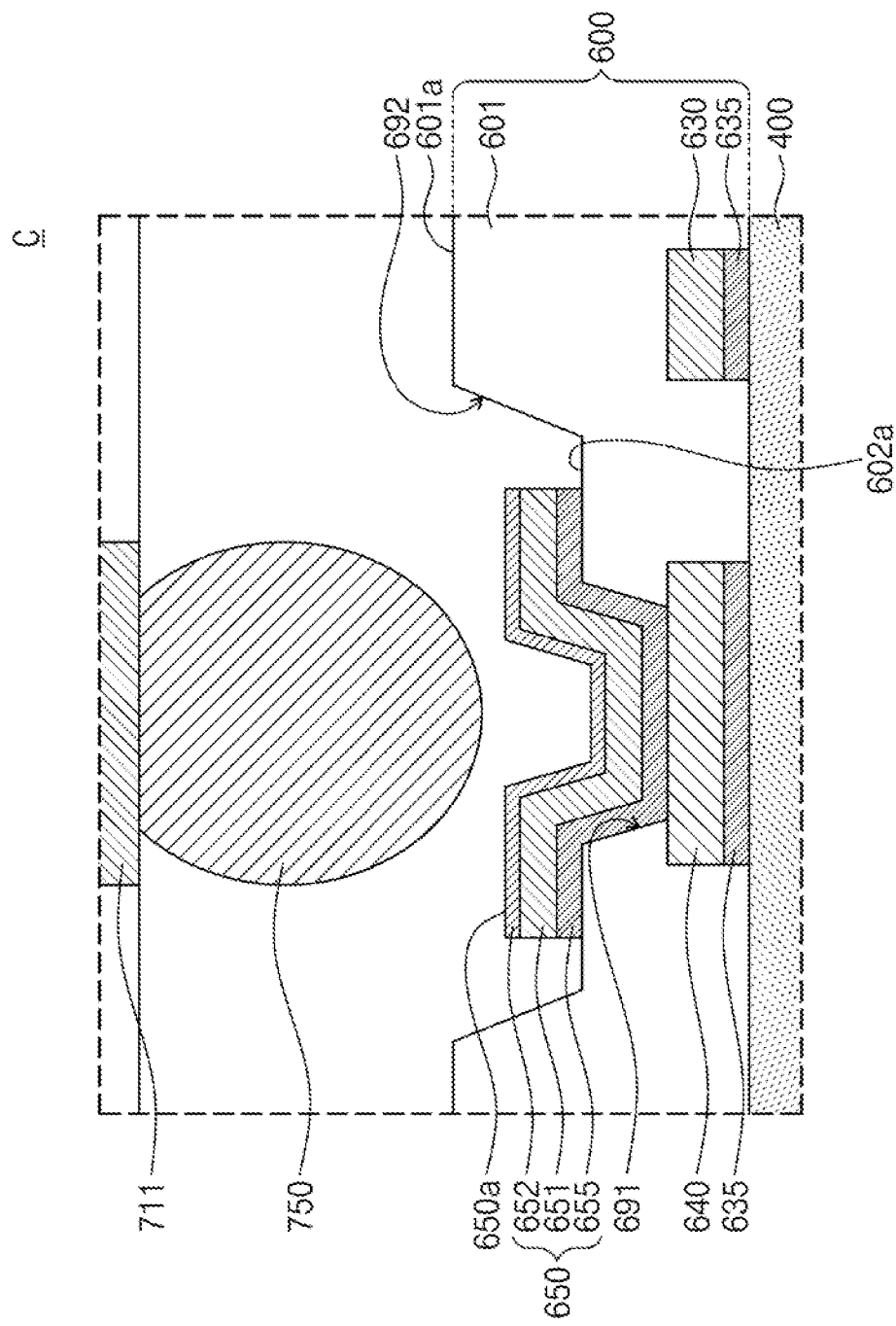
FIG. 3B is an enlarged view of section C of FIG. 3A.
Figure 3C:
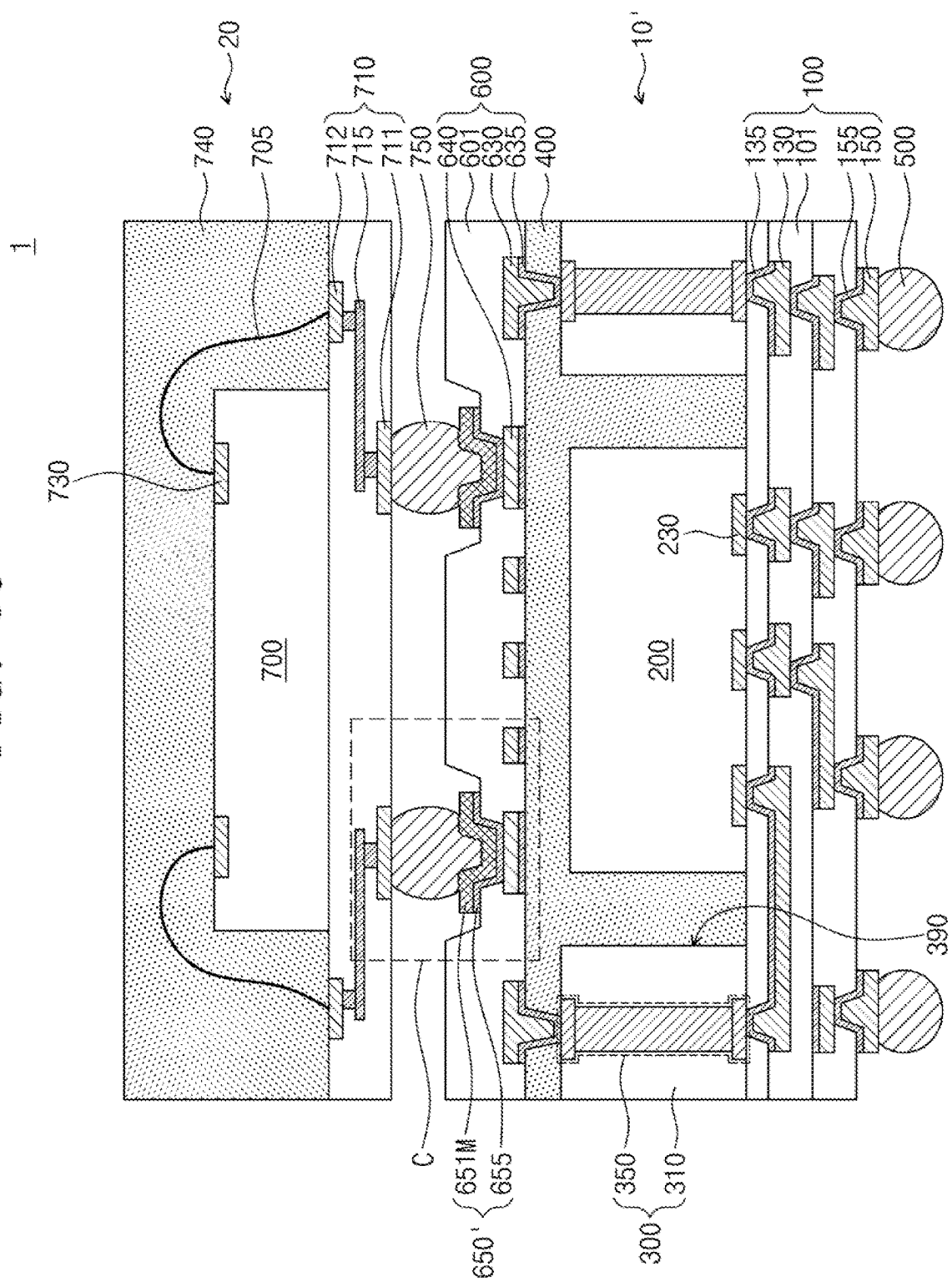
FIG. 3C is a cross-sectional view of a semiconductor package according to some embodiments.
Figure 3D:
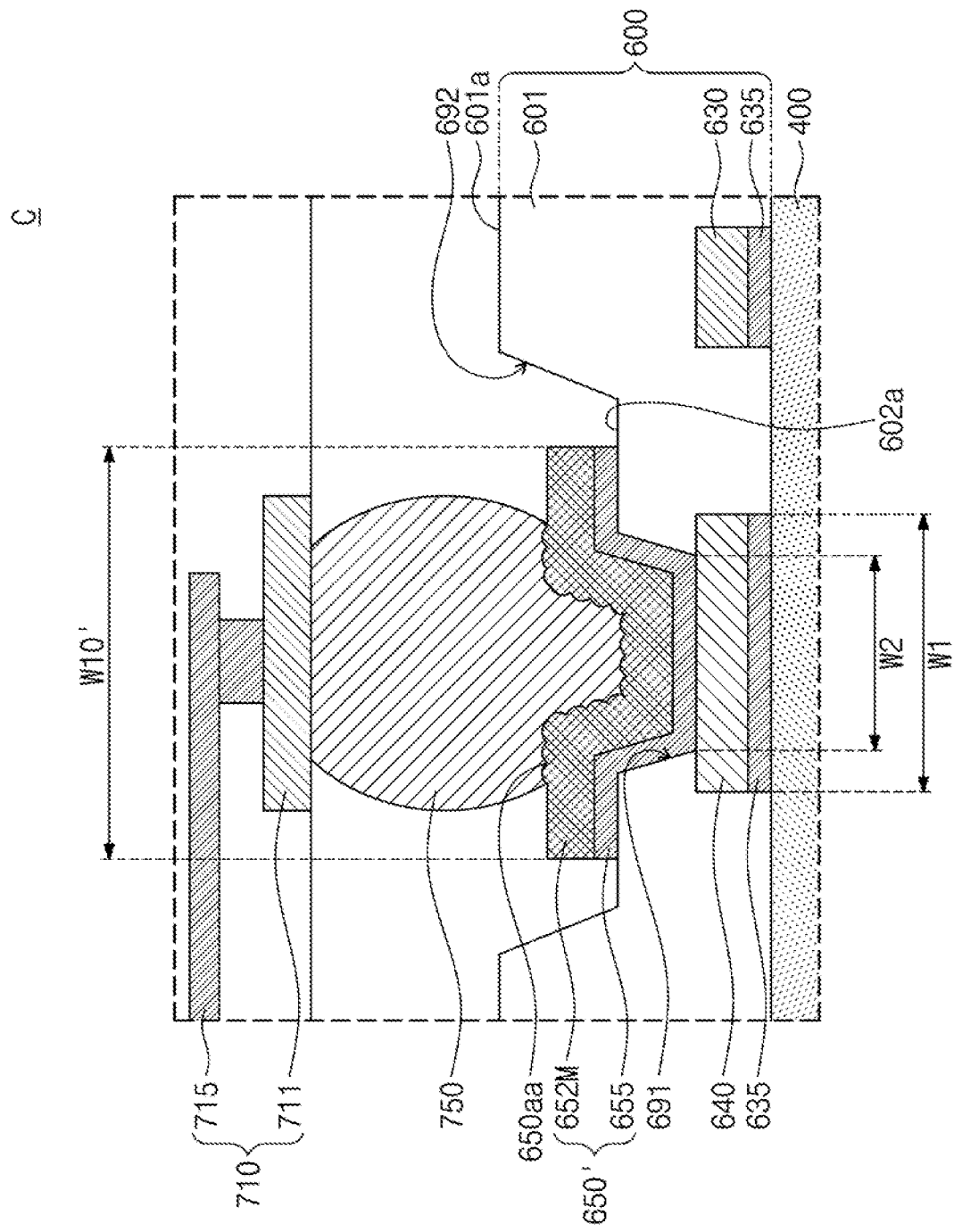
FIG. 3D is an enlarged view of section C of FIG. 3C.

FIG. 3A is a cross-sectional view that illustrates a procedure for connecting a lower package and an upper package to each other. FIG. 3B is an enlarged view of section C of FIG. 3A. FIG. 3C is a cross-sectional view of a semiconductor package according to some embodiments. FIG. 3D is an enlarged view of section C of FIG. 3C.

Referring to FIGS. 3A and 3B, according to some embodiments, a lower package 10' is prepared. The lower package 10' is substantially the same as the semiconductor package 10 discussed in the embodiment of FIGS. 1A and 1B. For example, the lower package 10' includes a first redistribution substrate 100, solder balls 500, a semiconductor chip 200, a molding layer 400, a connection substrate 300, a second redistribution substrate 600, and a second redistribution pad 650. Alternatively, the lower package 10' is substantially the same as the semiconductor package 10A of an embodiment shown in FIG. 2A, the semiconductor package 10B of an embodiment shown in FIG. 2B, the semiconductor package 10C of an embodiment shown in FIG. 2C, the semiconductor package 10D of an embodiment shown in FIG. 2D, or the semiconductor package 10E of an embodiment shown in FIG. 2E.

An upper package 20 is prepared. The upper package 20 includes an upper substrate 710 and an upper semiconductor chip 700. The upper substrate 710 may be a printed circuit board (PCB) or a redistribution layer. A first metal pad 711 and a second metal pad 712 are respectively disposed on a bottom surface and a top surface of the upper substrate 710. A metal line 715 coupled to the first metal pad 711 and the second metal pad 712 is disposed in the upper substrate 710.

The upper semiconductor chip 700 is mounted on the top surface of the upper substrate 710. A bonding wire 705 electrically connects a chip pad 730 on the top surface of the upper semiconductor chip 700 to the second metal pad 712. The upper semiconductor chip 700 may be of a different type from the semiconductor chip 200. For example, the upper semiconductor chip 720 may be a memory chip.

In other embodiments, the bonding wire 705 is omitted, and the upper semiconductor chip 700 is flip-chip mounted on the upper substrate 710. For example, upper bumps are disposed between and electrically connected to the upper substrate 710 and the upper semiconductor chip 700. In this case, the chip pad 730 of the upper semiconductor chip 720 is disposed on a bottom surface of the upper semiconductor chip 700.

In some embodiments, the upper package 20 further includes an upper molding layer 740. The upper molding layer 740 is disposed on the upper substrate 710 and covers the upper semiconductor chip 700. The upper molding layer 740 further covers the bonding wire 705. The upper molding layer 740 includes a dielectric polymer, such as an epoxy-based molding compound. In other embodiments, the upper molding layer 740 is omitted.

In other embodiments, the upper package 20 further includes a thermal radiation structure. The thermal radiation structure is disposed on the top surface of the upper semiconductor chip 700 and on a top surface of the upper molding layer 740. The thermal radiation structure includes at least one of a heat sink, a heat slug, or a thermal interface material (TIM) layer. The thermal radiation structure includes, for example, a metal.

In some embodiments, a connection solder ball 750 is disposed on the bottom surface of the upper substrate 710. For example, the connection solder ball 750 is disposed on a bottom surface of the first metal pad 711 and is electrically connected to the first metal pad 711.

The upper package 20 is placed on the lower package 10' so that the bottom surface of the upper substrate 710 faces toward a top surface of the second redistribution substrate 600. In this case, the connection solder ball 750 is vertically aligned with the second redistribution pad 650. Afterwards, the upper package 20 comes into contact with the second redistribution pad 650. For example, the connection solder ball 750 is in contact with the second bonding pad 652.

Referring to FIGS. 3C and 3D, the second redistribution pad 650 and the connection solder ball 750 undergo a joining process that connects the lower package 10' and the upper package 20 to each other. The joining process includes a soldering process executed on the second redistribution pad 650 and the connection solder ball 750. The soldering process includes an annealing process performed at a temperature the same as or less than a melting point of the connection solder ball 750. In the soldering process, a second metal in the first bonding pad 651, a third metal in the second bonding pad 652, and a solder material in the connection solder ball migrate and combine with each other. Therefore, the first bonding pad 651, the second bonding pad 652, and a lower portion of the connection solder ball 750 are changed into an intermetallic compound that forms a connection bonding pad 652M. The connection bonding pad 652M includes an intermetallic compound of the second metal, the third metal, and the solder material. As such, the second redistribution pad 650, which includes the first and second bonding pads 651 and 652, changes into a second redistribution pad 650' that includes the connection bonding pad 652M. The upper semiconductor chip 700 is electrically connected to the second redistribution substrate 600 through the connection solder ball 750 and the second redistribution pad 650'.

After the soldering process, the second seed pad 655 remains without changing into an intermetallic compound. The connection bonding pad 652M is interposed between the second seed pad 655 and the connection solder ball 750. The connection bonding pad 652M has a top surface in direct contact with the connection solder ball 750. The top surface of the connection bonding pad 652M corresponds to a top surface 650aa of the second redistribution pad 650'. The top surface 650aa of the second redistribution pad 650' is located at a lower level from the first top surface 601a of the second dielectric layer 601. The connection bonding pad 652M has a width W10' that is greater than the first width W1 and the second width W2.

The soldering process causes the third metal to diffuse from the second bonding pad 652 into the connection solder ball 750. Therefore, the remaining connection solder ball 750 further includes the third metal in addition to the solder material.

Through the processes described above, a semiconductor package 1 is eventually fabricated. The semiconductor package 1 includes the lower package 10', the upper package 20, and the connection solder ball 750.

Embodiments of the present inventive concepts can be variously combined with each other. For example, the conductive layer 660 of an embodiments shown in FIG. 2A may further be included in the semiconductor package 10B of an embodiments shown in FIG. 2B, the semiconductor package 10C of an embodiments shown in FIG. 2C, the semiconductor package 10D of an embodiments shown in FIG. 2D, or the semiconductor package 10E of an embodiments shown in FIG. 2E.

FIGS. 4A to 4K, 4M, and 4N are cross-sectional views that illustrate a method of fabricating a semiconductor package according to some embodiments. FIG. 4L is an enlarged view of section C of FIG. 4K. A duplicate description of components previously described will be omitted below.

Figure 4A:
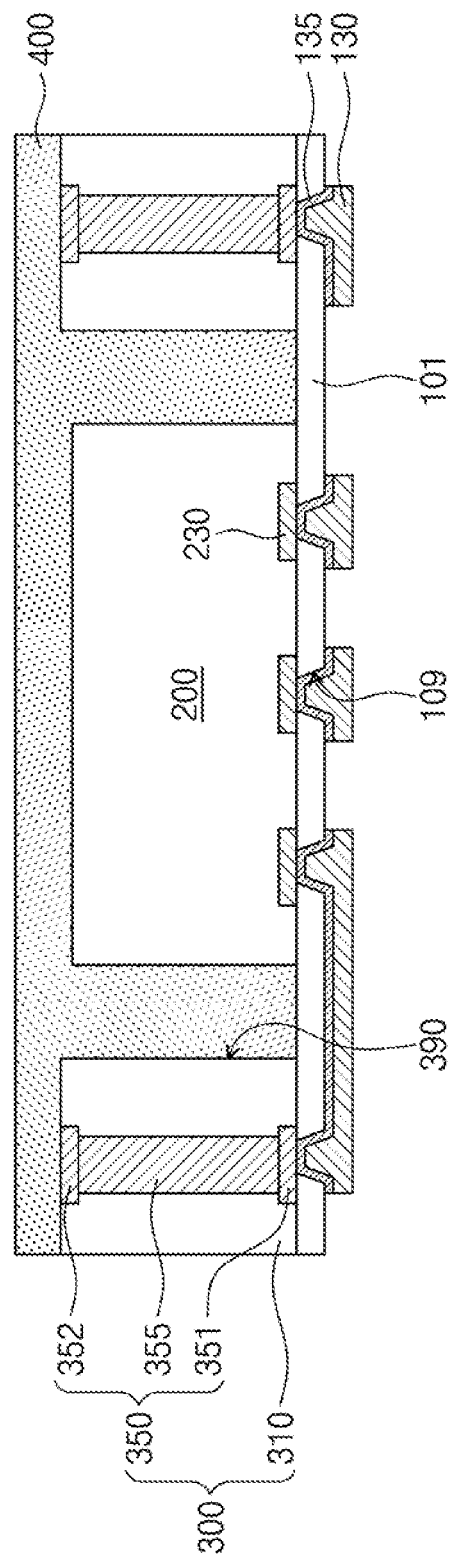
FIGS. 4A to 4K, 4M, and 4N are cross-sectional views that illustrate a method of fabricating a semiconductor package according to some embodiments.

Referring to FIG. 4A, in some embodiments, a semiconductor chip 200 is disposed in a substrate hole 390 of a connection substrate 300. The semiconductor chip 200 is spaced apart from a sidewall of the connection substrate 300. A molding layer 400 is formed on a top surface of the semiconductor chip 200 and on a top surface of the connection substrate 300. The molding layer 400 extends into a gap between the semiconductor chip 200 and the connection substrate 300. The molding layer 400 does not cover a bottom surface of the semiconductor chip 200 and a bottom surface of the connection substrate 300. Therefore, chip pads 230 of the semiconductor chip 200 and first pads 351 of the connection substrate 300 are exposed.

A first dielectric layer 101 is formed on and covers the bottom surface of the semiconductor chip 200 and the bottom surface of the connection substrate 300. The first dielectric layer 101 is formed by a coating process that uses a photo-imagable or photosensitive dielectric material. Holes 109 are formed in the first dielectric layer 101. Each of the holes 109 exposes one of the first pad 351 of the connection substrate 300 and the chip pad 230 of the semiconductor chip 200.

First seed patterns 135 and first redistribution patterns 130 are formed in the holes 109 and on a bottom surface of the first dielectric layer 101. The formation of the first seed patterns 135 and the first redistribution patterns 130 includes forming a first seed layer in the holes 109 and on the bottom surface of the first dielectric layer 101, forming on the first seed layer a lower resist pattern that has guide openings, performing an electroplating process in which the first seed layer is used as an electrode, removing the lower resist pattern to expose a portion of the first seed layer, and etching the exposed portion of the first seed layer.

The guide openings are spatially connected to corresponding holes 109. The electroplating process forms the first redistribution patterns 130 in the holes 109 and the guide openings. Each of the first redistribution patterns 130 includes a first via part and a first wire part that are connected to each other. The first via part of each of the first redistribution patterns 130 is formed in a corresponding hole 109. The first wire part is formed on the bottom surface of the first dielectric layer 101 and is disposed on one side of a lower portion of the first via part. An etching of the first seed layer correspondingly forms the first seed patterns 135 on top surfaces of the first redistribution patterns 130.

Figure 4B:
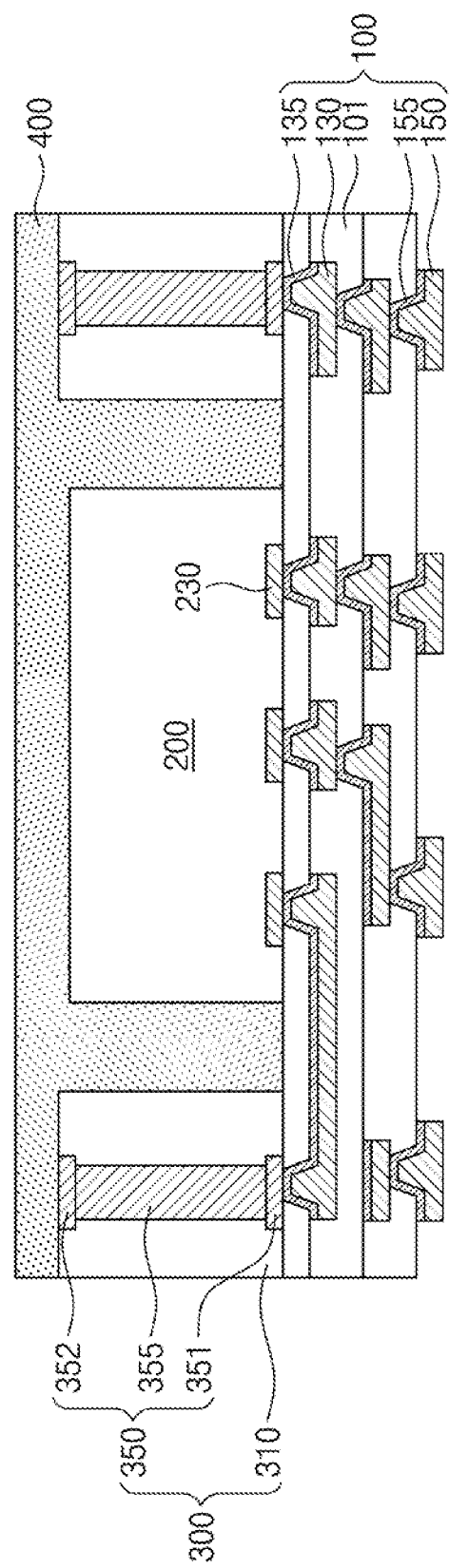
Figure 4C:
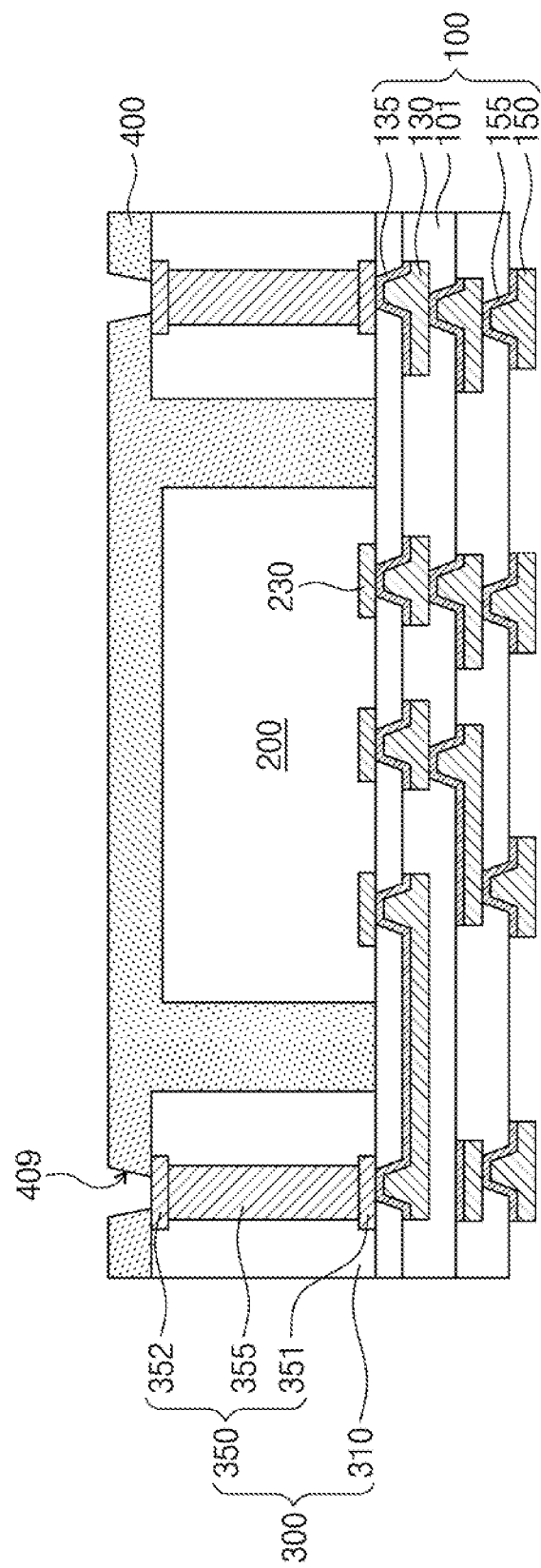

Referring to FIG. 4B, according to some embodiments, the formation of the first dielectric layer 101, the formation of the first seed patterns 135, and the formation of the first redistribution patterns 130 are repeatedly performed. Therefore, a plurality of stacked first dielectric layers 101 are formed, and a plurality of stacked first redistribution patterns 130 are also formed.

First redistribution pads 150 are formed in a lowermost first dielectric layer 101, and are coupled to the first redistribution patterns 130. First seed pads 155 are correspondingly formed on top surfaces of the first redistribution pads 150. According to some embodiments, the first redistribution pads 150 are formed by performing an electroplating process in which the first seed pads 155 are used as an electrode. Therefore, a first redistribution substrate 100 can be manufactured. The manufacturing of the first redistribution substrate 100 is achieved by a chip-first process. The first redistribution substrate 100 includes the first dielectric layers 101, the first seed patterns 135, the first redistribution patterns 130, the first seed pads 155, and the first redistribution pads 150.

Referring back to FIG. 4C, according to some embodiments, one or more mold holes 409 are formed in the molding layer 400. The mold holes 409 penetrate a top surface of the molding layer 400 and expose top surfaces of second pads 352.

Figure 4D:
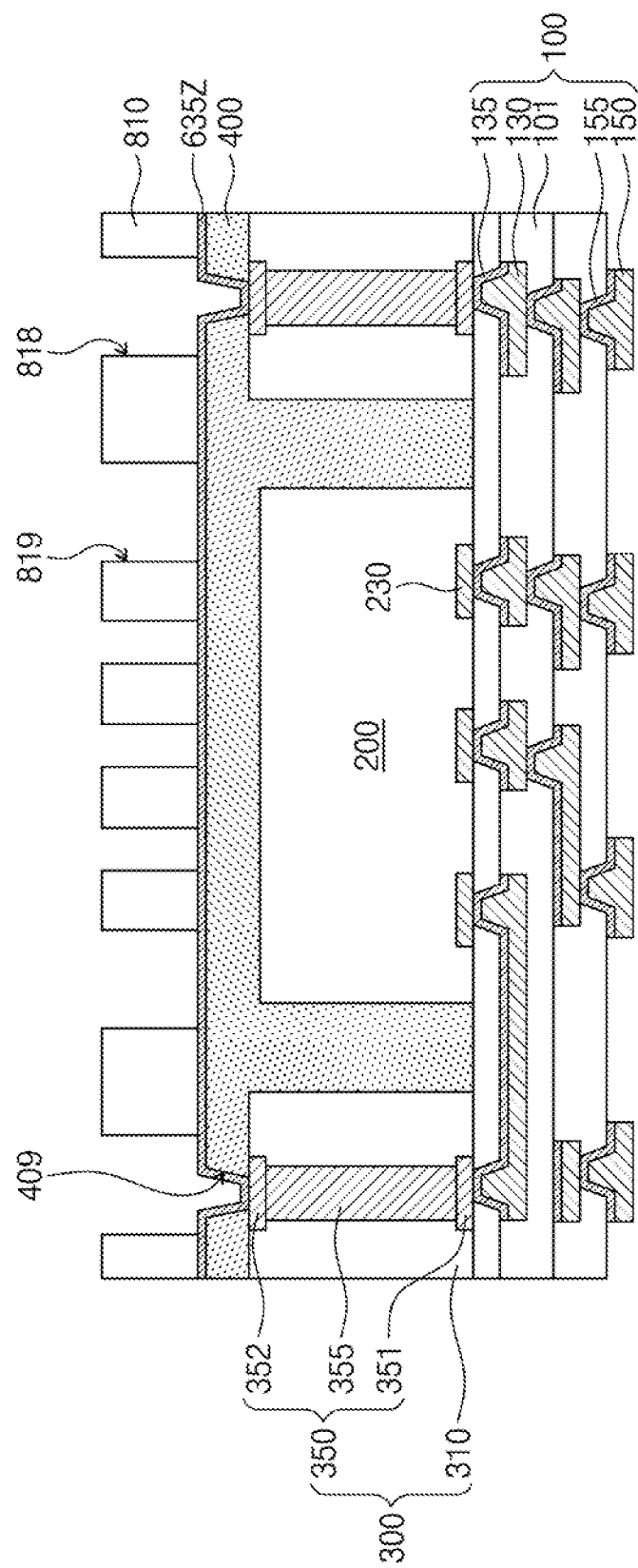

Referring to FIG. 4D, according to some embodiments, a second seed layer 635Z is formed on the top surface of the molding layer 400 and in the mold holes 409. The second seed layer 635Z conformally covers the exposed top surface of the second pad 352, a sidewall of the mold hole 409, and the top surface of the molding layer 400. An electroless plating process is performed that forms the second seed layer 635Z. The second seed layer 635Z may include copper, but embodiments of the present inventive concepts are not limited thereto.

A first resist pattern 810 is formed on a top surface of the second seed layer 635Z. The first resist pattern 810 includes an organic material, such as a polymer. Exposure and development processes are performed such that the first resist pattern 810 is patterned to form first guide openings 818 and second guide openings 819 in the first resist pattern 810. The first guide openings 818 and the second guide openings 819 expose the second seed layer 635Z. The first guide openings 818 vertically overlap the mold holes 409. The second guide openings 819 do not vertically overlap the mold holes 409.

Figure 4E:
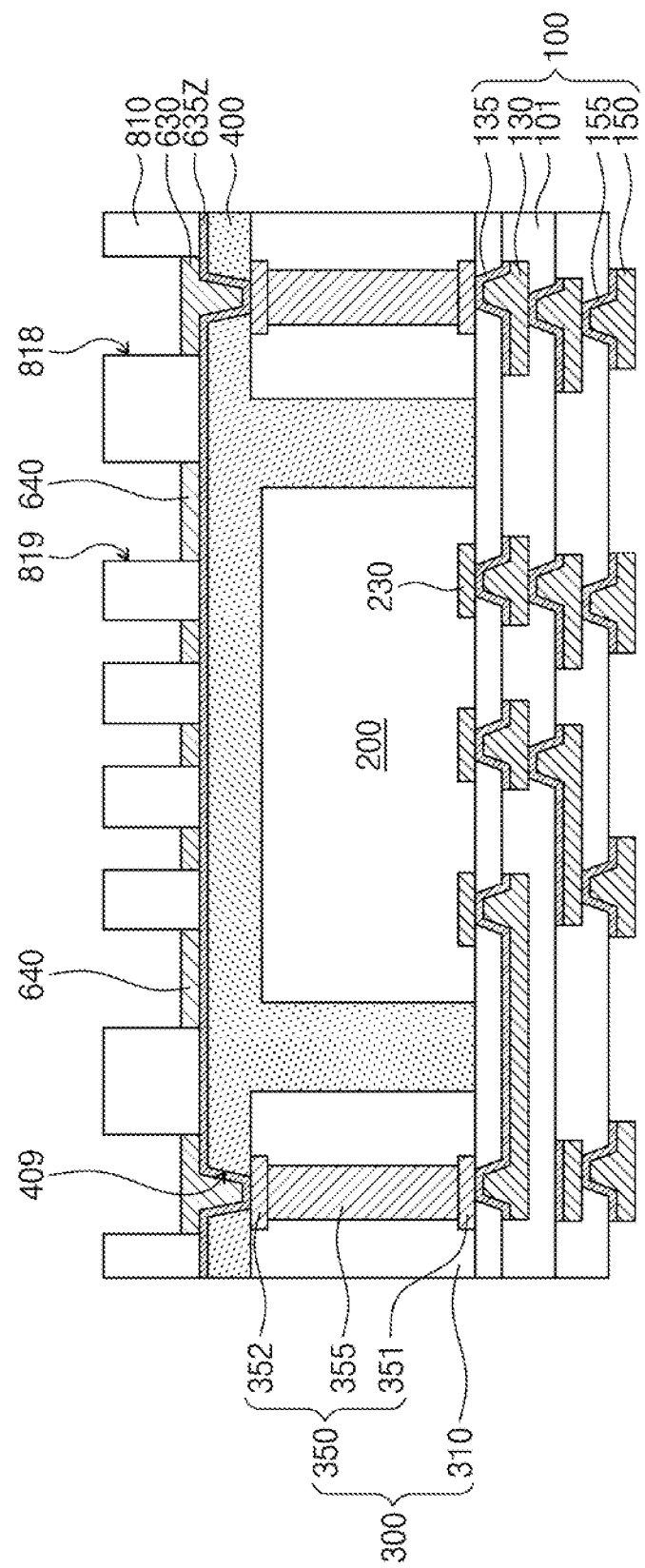

Referring to FIG. 4E, according to some embodiments, second redistribution patterns 630 and conductive pads 640 are formed on the second seed layer 635Z. The conductive pads 640 and the second redistribution patterns 630 are formed in a single process. The formation of the second redistribution patterns 630 and the conductive pads 640 includes performing an electroplating process in which the second seed layer 635Z is used as an electrode. Top surfaces of the second redistribution patterns 630 and the conductive pads 640 are located at a lower level from a top surface of the first resist pattern 810. The electroplating process stops before the second redistribution patterns 630 and the conductive pads 640 extend onto the top surface of the first resist pattern 810. Therefore, no planarization process is separately needed in forming the second redistribution patterns 630 and the conductive pads 640. Thus, the second redistribution patterns 630 and the conductive pads 640 can be simply manufactured.

The second seed layer 635Z includes a first part, a second part, and a third part. The first part of the second seed layer 635Z is located on a bottom surface of the conductive pad 640. The second part of the second seed layer 635Z is located on a bottom surface of the second redistribution pattern 630. The third part of the second seed layer 635Z is located on a bottom surface of the first resist pattern 810.

Figure 4F:
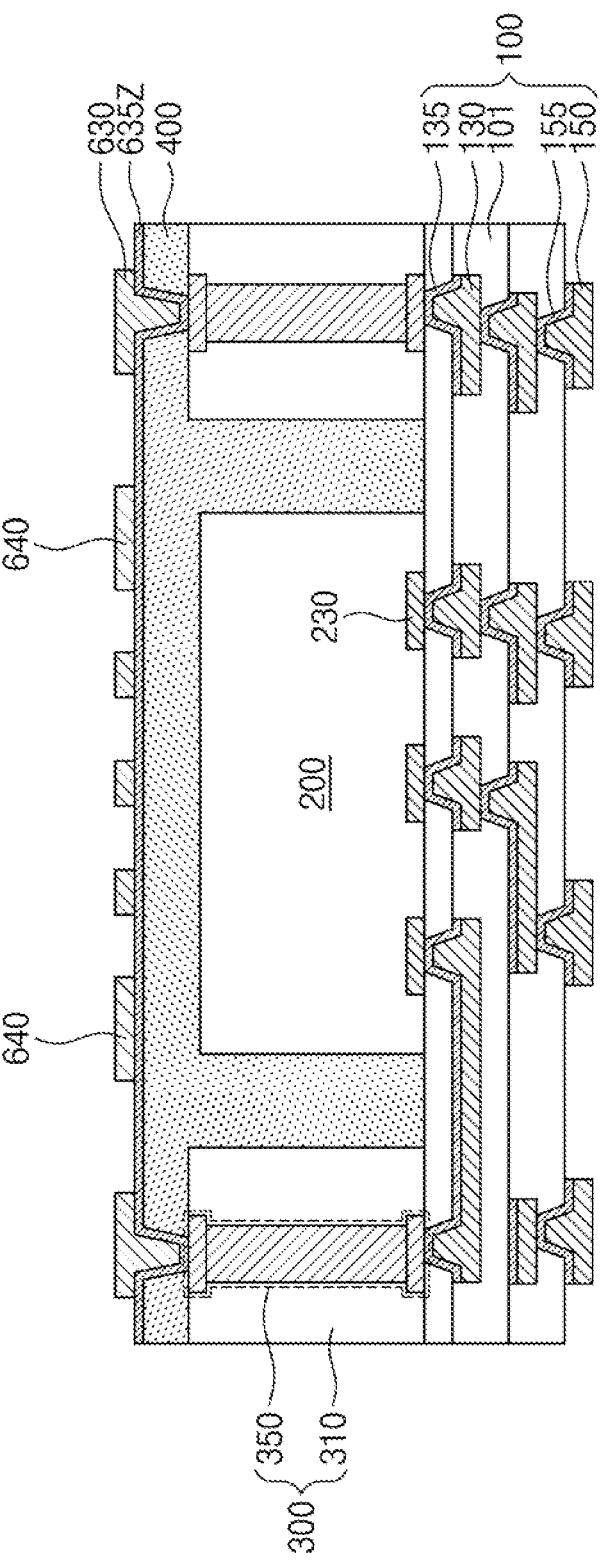

Referring to FIG. 4F, according to some embodiments, the first resist pattern 810 is removed that exposes the third part of the second seed layer 635Z. A strip process is performed to remove the first resist pattern 810.

Figure 4G:
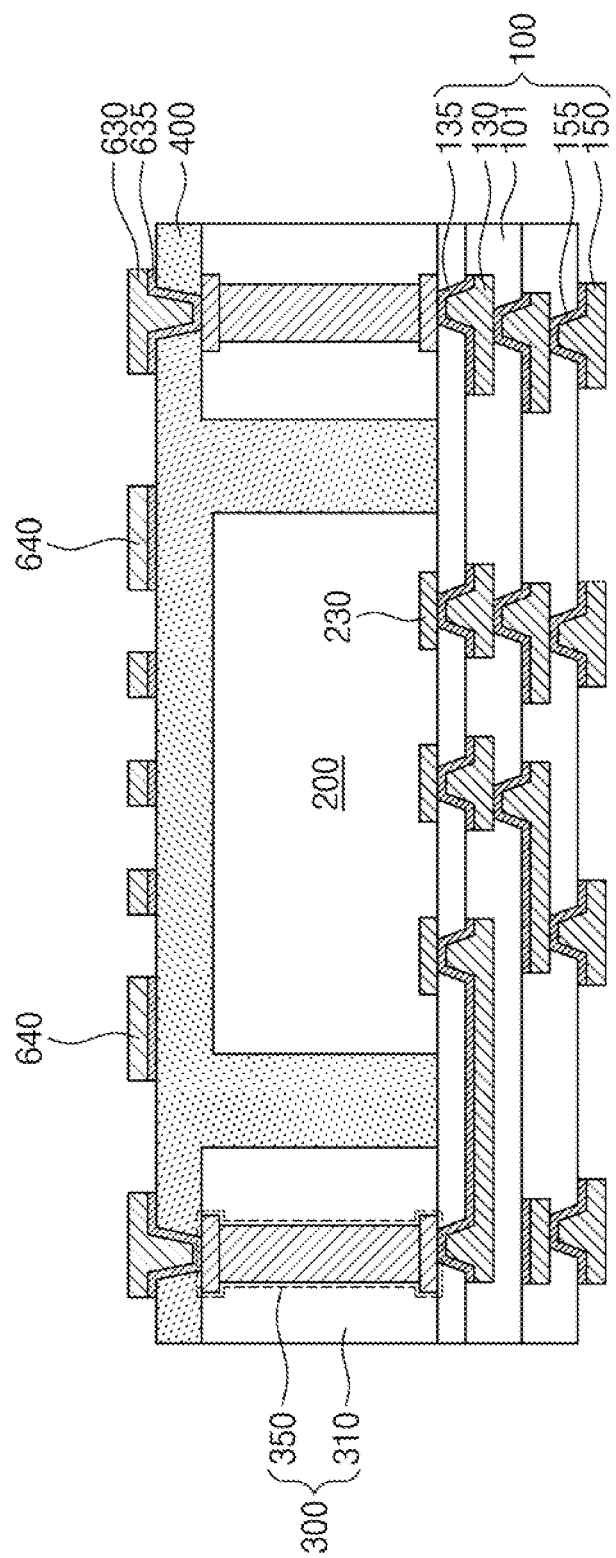

Referring to FIG. 4G, according to some embodiments, the second seed layer 635Z is patterned to form second seed patterns 635. An etching process is performed that patterns the second seed layer 635Z. The etching process removes the third part of the second seed layer 635Z to expose the molding layer 400. In the etching process, each of the conductive pad 640 and the second redistribution pattern 630 has an etch selectivity with respect to the second seed layer 635Z. The first and second parts of the second seed layer 635Z are not exposed in the etching process. After the termination of the etching process, the first and second parts of the second seed layer 635Z are formed into the second seed patterns 635.

Figure 4H:
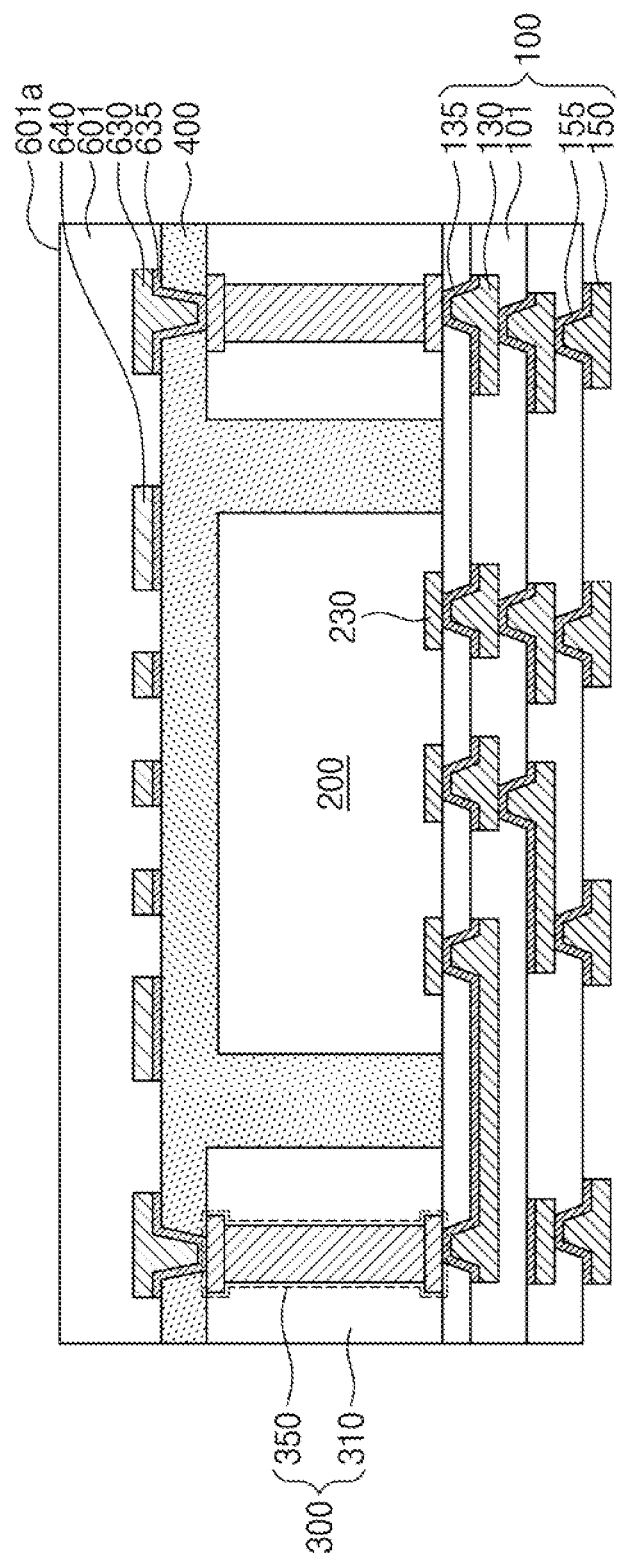

Referring to FIG. 4H, according to some embodiments, a second dielectric layer 601 that covers the conductive pads 640 and the second redistribution patterns 630 is formed on the molding layer 400. The second dielectric layer 601 includes at least one of an Ajinomoto build-up film, a solder resist material, or an organic material such as a photo-imagable dielectric material. A first top surface 601a of the second dielectric layer 601 is located at a higher level than the top surface of the conductive pad 640.

Figure 4I:
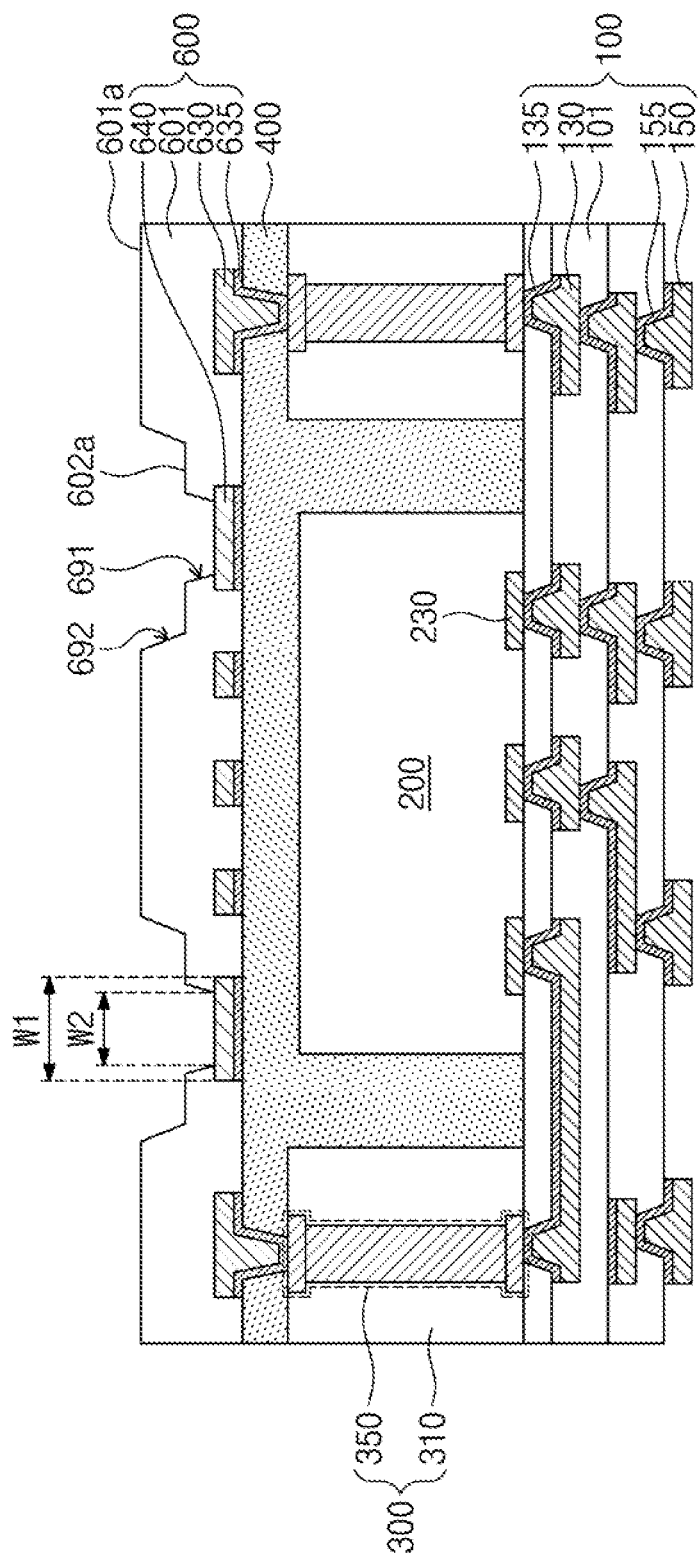

Referring to FIG. 4I, according to some embodiments, an opening is formed in the second dielectric layer 601. The opening includes a lower opening 691 and an upper opening 692. Each of the lower and upper openings 691 and 692 is formed by a laser drilling process.

The upper opening 692 is formed in an upper portion of the second dielectric layer 601 and penetrates the first top surface 601a of the second dielectric layer 601. The upper opening 692 includes a second top surface 602a in the second dielectric layer 601. The second top surface 602a of the second dielectric layer 601 corresponds to a bottom surface of the upper opening 692 and is located at a higher level than the top surface of the conductive pad 640.

The lower opening 691 is formed in a lower portion of the second dielectric layer 601 and penetrates the second top surface 602a of the second dielectric layer 601. The lower opening 691 exposes the conductive pad 640. The lower opening 691 is spatially connected to the upper opening 692. The lower opening 691 is contained within and surrounded by the upper opening 692. A second width W2 of the lower opening 691 is less than a first width W1 of the conductive pad 640 and less than a width of the bottom surface of the upper opening 692. The laser drilling process that forms the lower opening 691 is separately performed from the laser drilling that forms the upper opening 692.

Figure 4J:
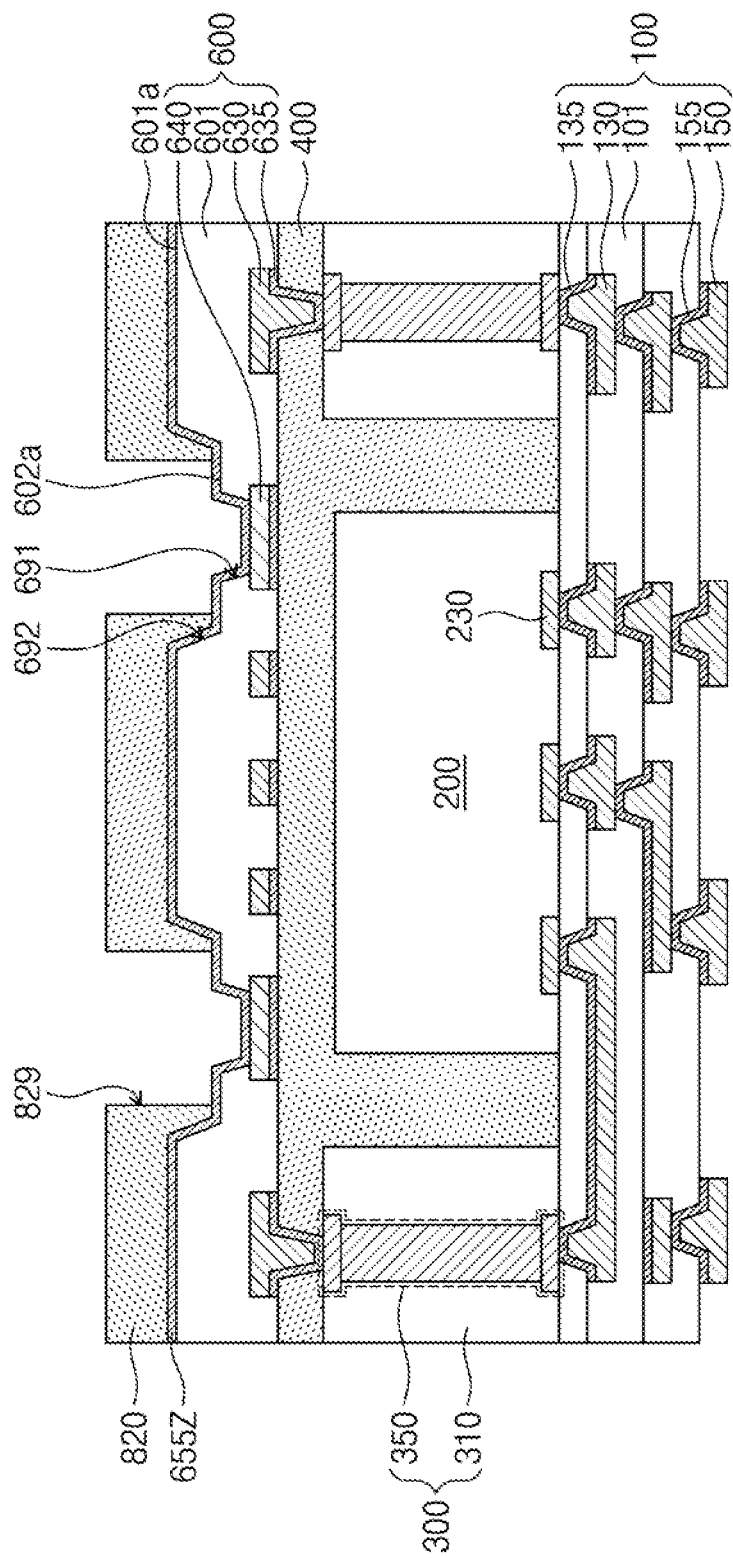

Referring to FIG. 4J, according to some embodiments, a preliminary seed pad 655Z and a second resist pattern 820 are formed. The preliminary seed pad 655Z conformally covers the exposed top surface of the conductive pad 640, a sidewall of the lower opening 691, the bottom surface and a sidewall of the upper opening 692, and the first top surface 601a of the second dielectric layer 601. The preliminary seed pad 655Z is in direct contact with the top surface of the conductive pad 640.

According to some embodiments, the second dielectric layer 601 includes at least one of an Ajinomoto build-up film or a solder resist material, and the preliminary seed pad 655Z is formed by an electroless plating process. In this case, the preliminary seed pad 655Z includes a same material as the conductive pad 640.

According to some embodiments, the second dielectric layer 601 includes a photo-imagable dielectric (PID) material, and the preliminary seed pad 655Z is formed by a sputtering method. In this case, the preliminary seed pad 655Z includes a material that differs from that of the conductive pad 640.

The preliminary seed pad 655Z includes a first part and a second part. The second resist pattern 820 is formed on a top surface at the second part of the preliminary seed pad 655Z. The second resist pattern 820 has an upper guide opening 829. The upper guide opening 829 is aligned with and spatially connected to the upper and lower openings 692 and 691. The upper guide opening 829 exposes the first part of the preliminary seed pad 655Z. The second resist pattern 820 further extends onto a sidewall of the upper opening 692. The second resist pattern 820 extends onto a bottom surface of the upper opening 692 and is thus further provided on a portion of the second top surface 602a of the second dielectric layer 601, but embodiments of the present inventive concepts are not limited thereto. The second resist pattern 820 includes an organic material, such as a polymer.

Figure 4K:
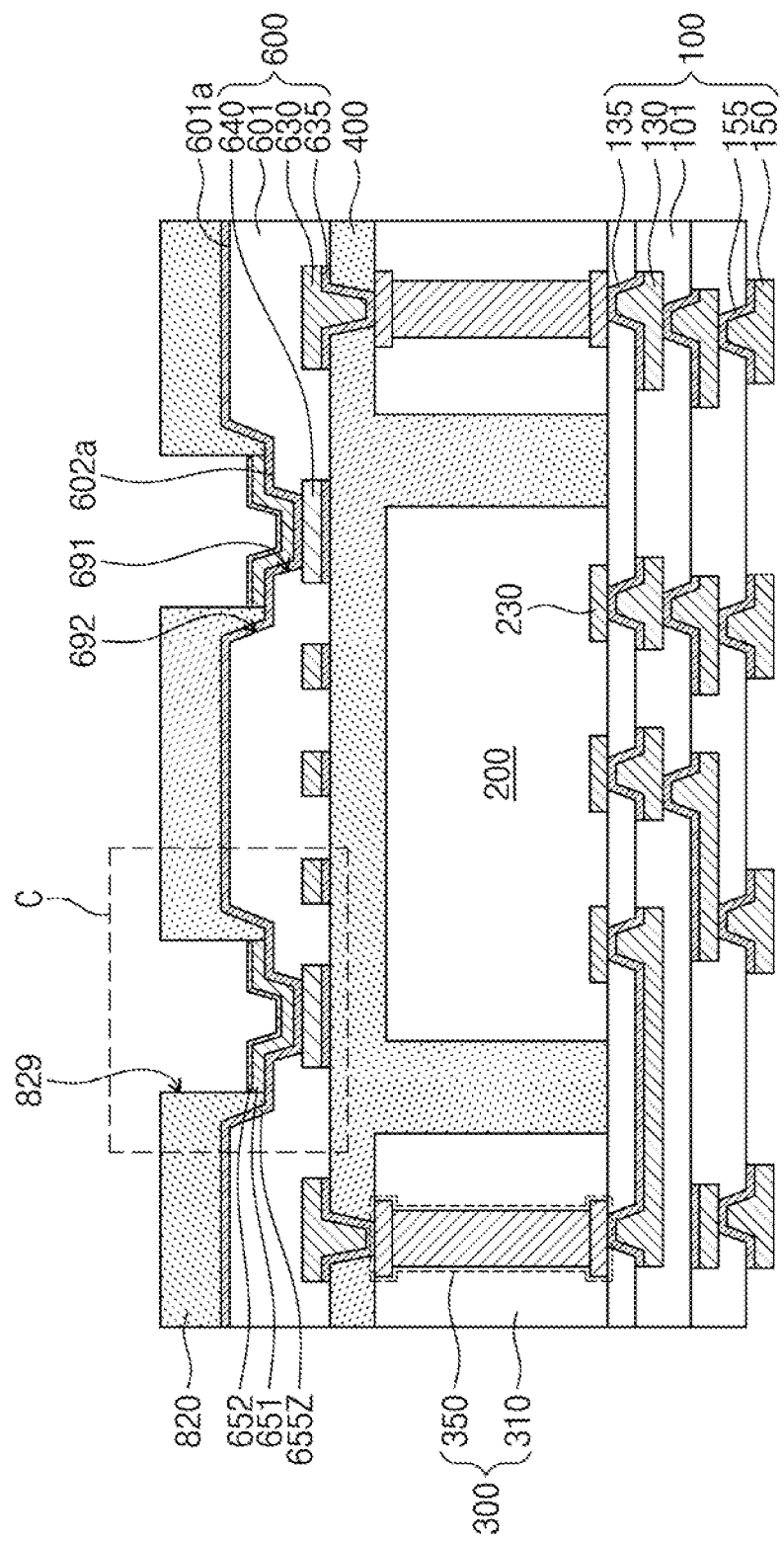
Figure 4L:
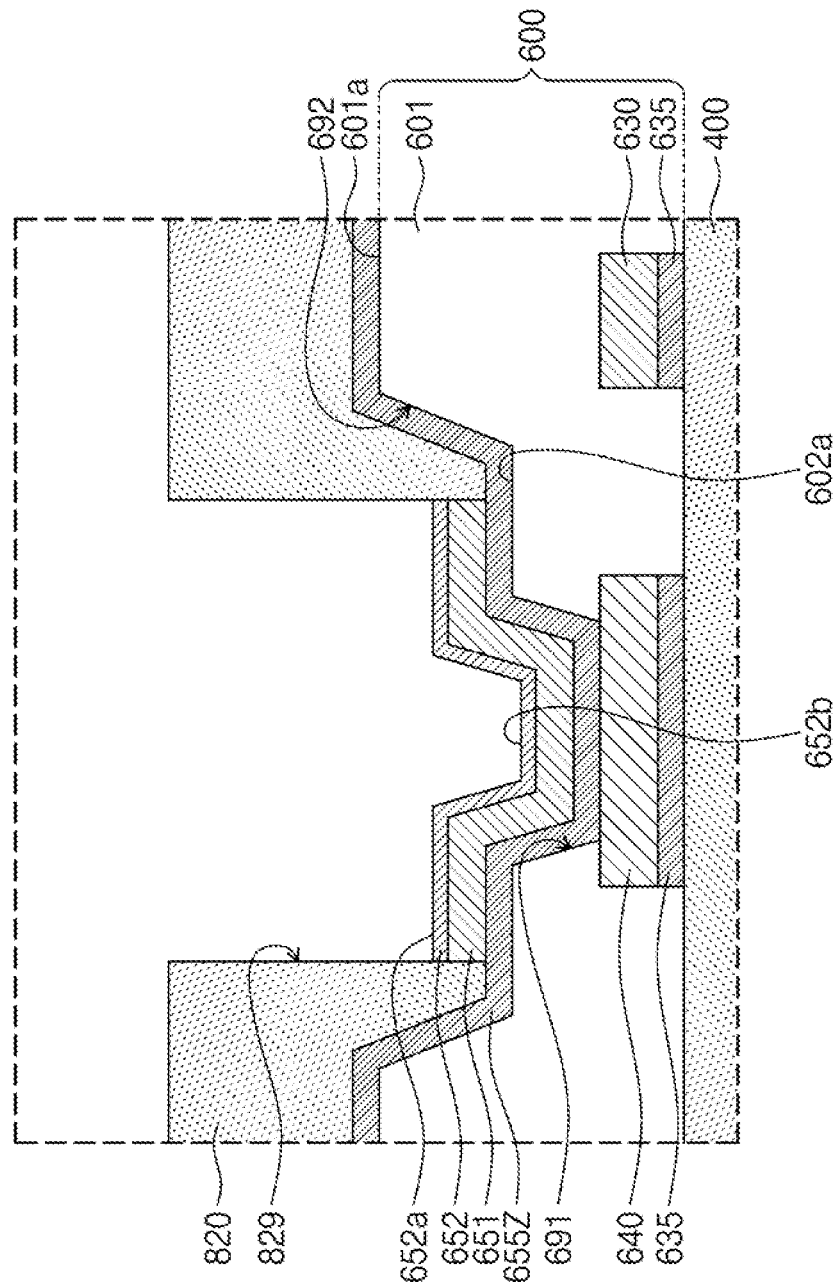
FIG. 4L is an enlarged view of section C of FIG. 4K.

Referring to FIGS. 4K and 4L, according to some embodiments, a first bonding pad 651 and a second bonding pad 652 are formed in the lower opening 691, the upper opening 692, and the upper guide opening 829.

The formation of the first and second bonding pads 651 and 652 includes performing an electroplating process in which the preliminary seed pad 655Z is used as an electrode. The first bonding pad 651 is in contact with the exposed top surface of the conductive pad 640. For example, the first bonding pad 651 is formed on the sidewall of the lower opening 691 and on the bottom surface of the upper opening 692, thereby conformally covering the preliminary seed pad 655Z. Therefore, the first bonding pad 651 has a stepped structure. For example, a top surface of the first bonding pad 651 on the second top surface 602a of the second dielectric layer 601 is located at a higher level than a top surface of the first bonding pad 651 on the conductive pad 640.

The second bonding pad 652 is formed on a top surface of the first bonding pad 651 and has a stepped structure. For example, a top surface of the second bonding pad 652 on the second top surface 602a of the second dielectric layer 601 is located at a higher level than a second surface 652b of the second bonding pad 652 on the conductive pad 640. The formation of the second bonding pad 652 stops before the first top surface 652a of the second bonding pad 652 has a same level as the first top surface 601a of the second dielectric layer 601. A width of the second bonding pad 652 is substantially the same as that of the first bonding pad 651 and the same as or greater than that of the conductive pad 640.

After the formation of the upper and lower openings 692 and 691, the formation of the second bonding pad 652 is performed. Therefore, the second bonding pad 652 is not exposed to the formation of the upper and lower openings 692 and 691. Therefore, damage to the second bonding pad 652 can be prevented.

Figure 4M:
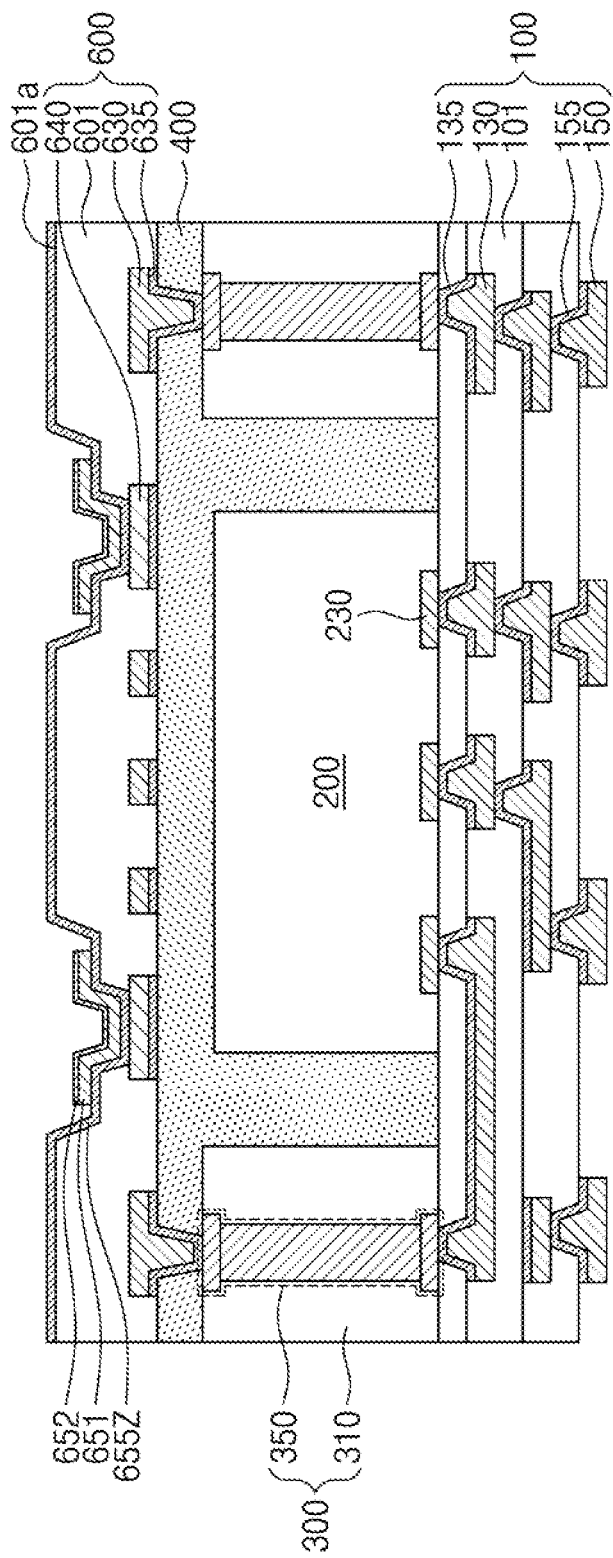

Referring to FIG. 4M, according to some embodiments, the second resist pattern 820 is removed to expose the top surface at the second part of the preliminary seed pad 655Z. A strip process is performed to remove the second resist pattern 820.

Figure 4N:
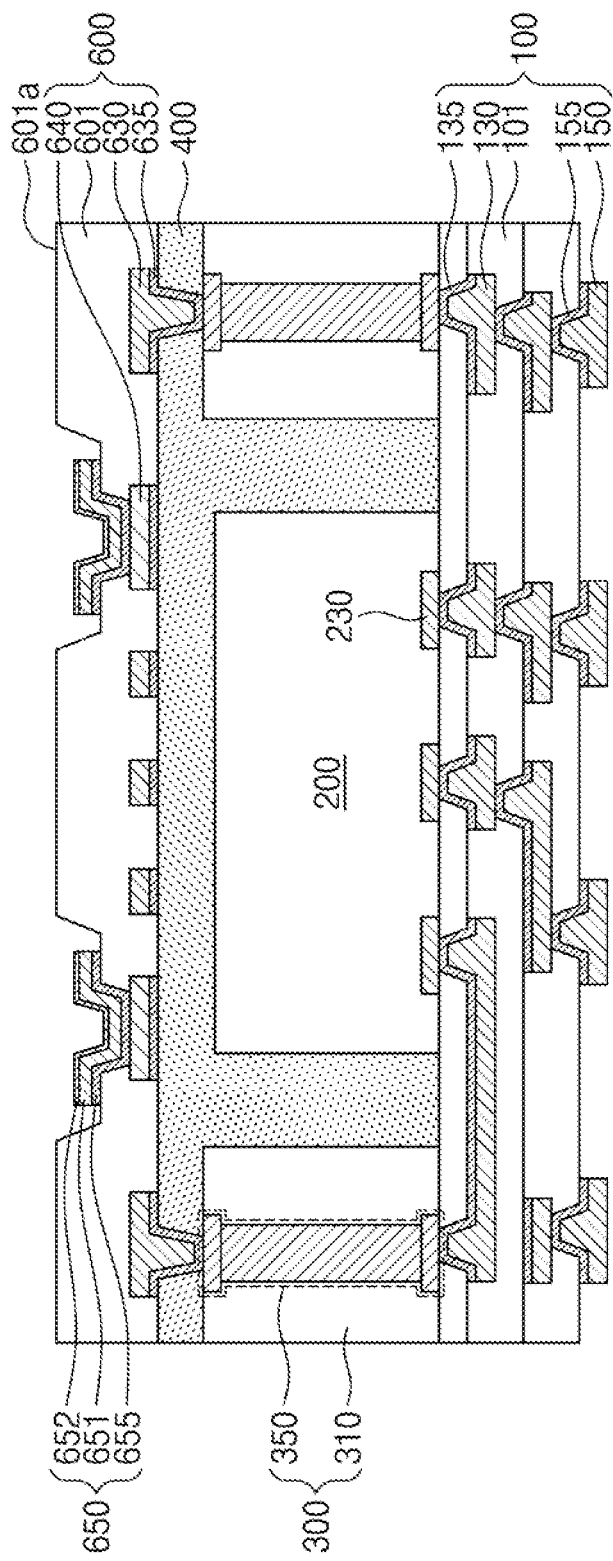

Referring to FIGS. 4N and 1C, according to some embodiments, the preliminary seed pad 655Z is patterned to form a second seed pad 655. An etching process is performed to pattern the preliminary seed pad 655Z. The etching process removes the second part of the preliminary seed pad 655Z, which exposes the second dielectric layer 601. In the etching process, the second bonding pad 652 has an etch selectivity with respect to the preliminary seed pad 655Z. The first part of the second seed layer 635Z is not exposed by the etching process. After the etching process terminates, the first part of the preliminary seed pad 655Z is formed into the second seed pad 655. The second seed pad 655 remains on a bottom surface of the first bonding pad 651. Therefore, a second redistribution pad 650 is manufactured. The second redistribution pad 650 includes the second seed pad 655, the first bonding pad 651, and the second bonding pad 652.

Referring back to FIG. 1B, according to some embodiments, solder balls 500 are correspondingly formed on bottom surfaces of the first redistribution pads 150 and are coupled to the first redistribution pads 150. Through the processes discussed above, a semiconductor package 10 is fabricated.

Figure 5A:
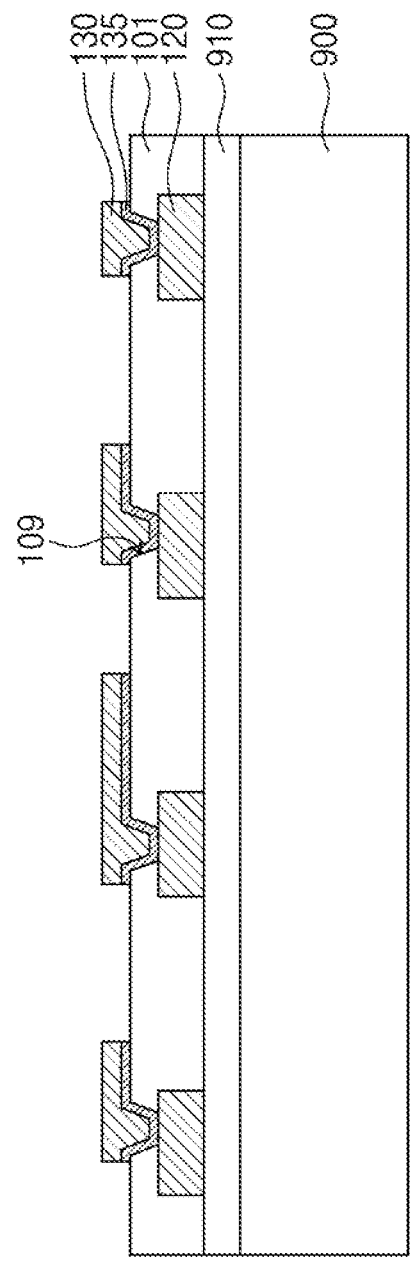
FIGS. 5A to 5C are cross-sectional views that illustrate a method of fabricating a semiconductor package according to some embodiments.
Figure 5B:
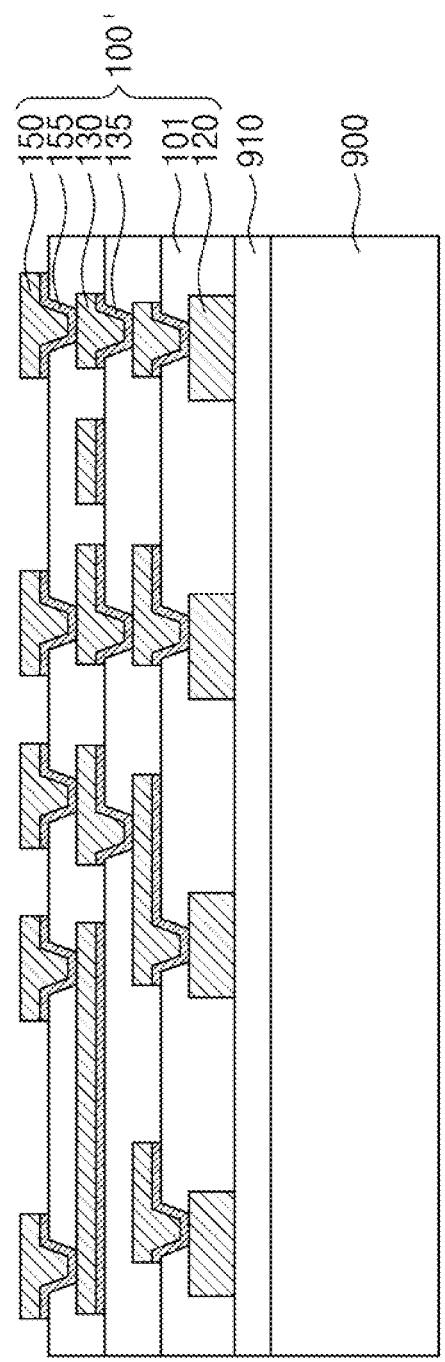
Figure 5C:
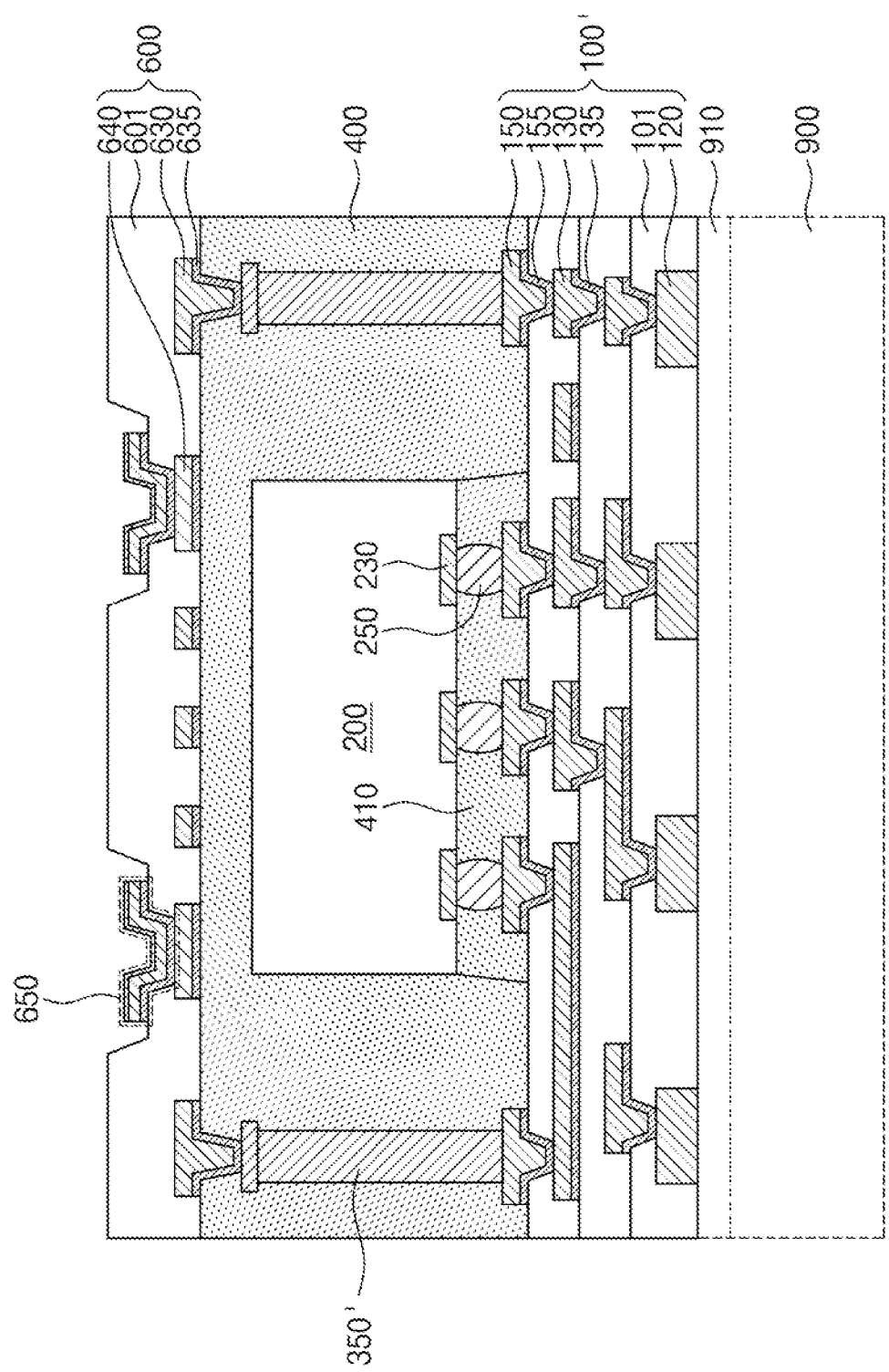

FIGS. 5A to 5C are cross-sectional views that illustrate a method of fabricating a semiconductor package according to some embodiments.

Referring to FIG. 5A, according to some embodiments, under-bump patterns 120, a first dielectric layer 101, first seed patterns 135, and first redistribution patterns 130 are formed on a carrier substrate 900. A carrier adhesion layer 910 is further formed between the carrier substrate 900 and the first dielectric layer 101 and between the carrier substrate 900 and the under-bump patterns 120. The carrier adhesion layer 910 attaches the first dielectric layer 101 and the under-bump patterns 120 to the carrier substrate 900. The carrier adhesion layer 910 is a release layer.

According to some embodiments, an electroplating process forms the under-bump patterns 120 on the carrier adhesion layer 910. The first dielectric layer 101 is formed on the carrier adhesion layer 910 and covers sidewalls and top surfaces of the under-bump patterns 120. Holes 109 are formed in the first dielectric layer 101 that expose the under-bump patterns 120.

The formation of the first seed patterns 135 and the first redistribution patterns 130 includes forming a first seed layer in the holes 109 and on a top surface of the first dielectric layer 101, forming on the first seed layer a resist pattern that has guide openings, performing an electroplating process in which the first seed layer is used as an electrode, removing the resist pattern to expose a portion of the first seed layer, and etching the exposed portion of the first seed layer.

Each of the first redistribution patterns 130 includes a first via part and a first wire part. The first via part is formed in a corresponding hole 109, and the first wire part is formed on the first dielectric layer 101. The etching of the first seed layer correspondingly forms the first seed patterns 135 on bottom surfaces of the first redistribution patterns 130.

Referring to FIG. 5B, according to some embodiments, the formation of the first dielectric layer 101, the formation of the first seed patterns 135, and the formation of the first redistribution patterns 130 is repeatedly performed. In this case, stacked first dielectric layers 101 and stacked first redistribution patterns 130 are formed.

First redistribution pads 150 are formed in an uppermost first dielectric layer 101, and are coupled to the first redistribution patterns 130. First seed pads 155 are correspondingly formed on bottom surfaces of the first redistribution pads 150. The formation of the first redistribution pads 150 and the first seed pads 155 is similar to that described above with reference to FIG. 4B. Therefore, a first redistribution substrate 100' is manufactured. The manufacturing of the first redistribution substrate 100' is achieved by a chip-last process. The first redistribution substrate 100' includes the first dielectric layers 101, the under-bump patterns 120, the first seed patterns 135, the first redistribution patterns 130, the first seed pads 155, and the first redistribution pads 150.

Referring to FIG. 5C, according to some embodiments, a semiconductor chip 200 and conductive structures 350' are formed on a top surface of the first redistribution substrate 100'. First bumps 250 are further formed between the first redistribution substrate 100' and the semiconductor chip 200, thereby coupling the first bumps 250 to the first redistribution pads 150 and to chip pads 230 of the semiconductor chip 200. A first under-fill layer 410 is interposed between the first redistribution substrate 100' and the semiconductor chip 200, thereby encapsulating the first bumps 250. The conductive structure 350' are substantially the same as those described with reference to FIG. 2E.

A molding layer 400 that covers the semiconductor chip 200 and the conductive structures 350' is formed on the top surface of the first redistribution substrate 100'. The molding layer 400 does not cover top surfaces of the conductive structures 350'. A second redistribution substrate 600 is formed on the molding layer 400. The formation of the second redistribution substrate 600 is the same as that described with reference to FIGS. 4D to 4I.

A second redistribution pad 650 is formed on the second dielectric layer 601, thereby coupling the second redistribution pad 650 to the conductive pad 640. The formation of the second redistribution pad 650 is the same as that described with reference to FIG. 4J to 4N.

Afterwards, the carrier substrate 900 and the carrier adhesion layer 910 are removed to expose the first redistribution pads 150.

Referring back to FIG. 2E, according to some embodiments, solder balls 500 are correspondingly formed on bottom surfaces of the first redistribution pads 150. Through the processes discussed above, a semiconductor package 10E is fabricated.

According to embodiments of the present inventive concepts, a redistribution pad is formed by a plating process that uses a seed pad, and thus a plating bar is not needed to form the redistribution pad. The redistribution pad extends onto a top surface of a second dielectric layer, and thus has a width that does not depend on that of a conductive pad. Accordingly, an area on which redistribution patterns are arranged can be increased and to freely dispose the redistribution patterns.

This detailed description of the present inventive concepts should not be construed as being limited to embodiments set forth herein, and embodiments of the present inventive concepts are intended to cover the various combinations, modifications and variations without departing from the spirit and scope of the present inventive concepts.

What is claimed is:

1. A semiconductor package, comprising:
a first redistribution substrate;
a semiconductor chip disposed on a top surface of the first redistribution substrate;
a molding layer disposed on the first redistribution substrate, wherein the molding layer covers the semiconductor chip;
a second redistribution substrate disposed on the molding layer, wherein the second redistribution substrate includes a dielectric layer, a redistribution pattern, and a conductive pad, wherein the dielectric layer includes a lower opening that exposes the conductive pad, and an upper opening connected to the lower opening, wherein a width of the upper opening is greater than a width of the lower opening; and
a redistribution pad disposed on the conductive pad, wherein the redistribution pad covers a sidewall of the lower opening and at least a portion of a bottom surface of the upper opening,
wherein a top surface of the dielectric layer is located at a higher level than a first top surface of the redistribution pad,
wherein the first top surface of the redistribution pad is located on the bottom surface of the upper opening.

2. The semiconductor package of claim 1, wherein the redistribution pad includes:
a seed pad that covers the sidewall of the lower opening and at least a portion of the bottom surface of the upper opening; and
a first bonding pad disposed on the seed pad.

3. The semiconductor package of claim 2, wherein the redistribution pad further includes a second bonding pad disposed on the first bonding pad,
wherein the second bonding pad includes a material that differs from a material of the first bonding pad and from a material of the seed pad.

4. The semiconductor package of claim 1, wherein a width of the redistribution pad is greater than a width of the conductive pad.

5. The semiconductor package of claim 1, wherein
a first width of the conductive pad is greater than a second width of a bottom surface of the lower opening, and
a difference between the first width and the second width is in a range from about 5 μm to about 30 μm.

6. The semiconductor package of claim 1, wherein the second redistribution substrate further includes a plurality of seed patterns,
wherein the plurality of seed patterns are disposed on a bottom surface of the redistribution pattern and a bottom surface of the conductive pad.

7. The semiconductor package of claim 1, wherein a level difference between the top surface of the dielectric layer and the first top surface of the redistribution pad is in a range from about 0.1 μm to about 20 μm.

8. The semiconductor package of claim 1, further comprising a connection substrate disposed on the top surface of the first redistribution substrate and spaced apart from the semiconductor chip,
wherein the connection substrate includes a base layer and a conductive structure in the base layer, and
wherein the molding layer is interposed between the connection substrate and the semiconductor chip.

9. The semiconductor package of claim 8, wherein
the conductive pad is disposed on one side of the redistribution pattern and electrically connected to the redistribution pattern, and
the redistribution pattern is electrically connected to the conductive structure.

10. The semiconductor package of claim 9, wherein the dielectric layer covers the redistribution pattern and a portion of a top surface of the conductive pad, and does not cover the first top surface of the redistribution pad.

11. A semiconductor package, comprising:
a first redistribution substrate;
a semiconductor chip disposed on a top surface of the first redistribution substrate;
a conductive structure disposed on the top surface of the first redistribution substrate and spaced apart from the semiconductor chip;
a second redistribution substrate disposed on the semiconductor chip and the conductive structure, wherein the second redistribution substrate includes a dielectric layer and a conductive pad, wherein the dielectric layer includes an opening that exposes a portion of the conductive pad; and
a redistribution pad disposed on the conductive pad and in the opening,
wherein the dielectric layer includes:
a first top surface located at a higher level than a top surface of the redistribution pad; and
a second top surface located at a lower level than the first top surface and at a higher level than a top surface of the conductive pad, and
wherein the redistribution pad includes:
a seed pad disposed on at least a portion of the second top surface of the dielectric layer; and
a bonding pad disposed on the seed pad.

12. The semiconductor package of claim 11, wherein the dielectric layer includes:
an upper opening that penetrates the first top surface and exposes the second top surface; and
a lower opening that penetrates the second top surface and is connected with the upper opening,
wherein a width at a bottom surface of the upper opening is greater than a width at a bottom surface of the lower opening.

13. The semiconductor package of claim 11, wherein the seed pad includes a first metal, the bonding pad includes an intermetallic compound of a second metal and a solder material, and the second metal differs from the first metal.

14. The semiconductor package of claim 11, further comprising:
    an upper package disposed on the second redistribution substrate; and
    a connection solder ball interposed between the redistribution pad and the upper package, wherein the connection solder ball is in contact with the bonding pad.

15. The semiconductor package of claim 11, wherein
    the conductive pad is electrically connected to the conductive structure, and
    a width of the redistribution pad is greater than a width of the conductive pad.

16. The semiconductor package of claim 11, further comprising:
    a plurality of bumps interposed between the first redistribution substrate and the semiconductor chip; and
    a solder ball disposed on a bottom surface of the first redistribution substrate.

17. A semiconductor package, comprising:
    a first redistribution substrate including a first dielectric layer, a first seed pattern, and a first redistribution pattern;
        a solder ball on a bottom surface of the first redistribution substrate;
    a semiconductor chip disposed on a top surface of the first redistribution substrate;
    a conductive structure disposed on the top surface of the first redistribution substrate and laterally spaced apart from the semiconductor chip;
    a molding layer disposed between the semiconductor chip and the conductive structure, wherein the molding layer covers the semiconductor chip;
    a second redistribution substrate disposed on the molding layer, wherein the second redistribution substrate includes a dielectric layer, a redistribution pattern, and a conductive pad; and
    a redistribution pad disposed on the conductive pad,
    wherein the redistribution pad is electrically connected to the conductive structure through the conductive pad and the redistribution pattern,
    wherein the dielectric layer includes:
        a lower opening that exposes the conductive pad; and
        an upper opening connected to the lower opening, wherein a width of the upper opening is greater than a width of the lower opening; and
    wherein the redistribution pad covers a sidewall of the lower opening and at least a portion of a bottom surface of the upper opening, and
    wherein a top surface of the dielectric layer is located at a higher level than the first top surface of the redistribution pad.

18. The semiconductor package of claim 17, wherein
    a first width of the conductive pad is greater than a second width at a bottom surface of the lower opening,
    a width of the redistribution pad is greater than the first width and the second width, and
    a difference between the first width and the second width is in a range from about 5 μm to about 30 μm.

19. The semiconductor package of claim 17, wherein the redistribution pad includes:
    a seed pad that covers the sidewall of the lower opening and at least a portion of the bottom surface of the upper opening, wherein the seed pad includes a first metal;
    a first bonding pad disposed on the seed pad, wherein the first bonding pad includes a second metal; and
    a second bonding pad disposed on the first bonding pad, wherein the second bonding pad includes a third metal,
    wherein the second metal differs from the first metal, and
    wherein the third metal differs from the first metal and the second metal.

20. The semiconductor package of claim 17, further comprising:
    an upper package disposed on the second redistribution substrate; and
    a connection solder ball interposed between the redistribution pad and the upper package,
    wherein the redistribution pad includes:
        a seed pad that covers the sidewall of the lower opening and at least a portion of the bottom surface of the upper opening, wherein the seed pad includes a first metal; and
        a connection bonding pad disposed on the seed pad,
    wherein the connection bonding pad includes an intermetallic compound of a second metal, a third metal, and a solder material,
    wherein the second metal differs from the first metal, and
    wherein the third metal differs from the first metal and the second metal.

* * * * *